(12) United States Patent
Maharyta et al.

(10) Patent No.: US 11,561,249 B2
(45) Date of Patent: Jan. 24, 2023

(54) INDUCTIVE SENSING METHODS, DEVICES AND SYSTEMS

(71) Applicant: Cypress Semiconductor Corporation, San Jose, CA (US)

(72) Inventors: Andriy Maharyta, Lviv (UA); Mykhaylo Krekhovetskyy, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 154 days.

(21) Appl. No.: 17/125,808

(22) Filed: Dec. 17, 2020

(65) Prior Publication Data

US 2022/0196437 A1 Jun. 23, 2022

(51) Int. Cl.
*G01R 27/26* (2006.01)
*H03K 17/95* (2006.01)
*G01D 5/22* (2006.01)

(52) U.S. Cl.
CPC .......... *G01R 27/2611* (2013.01); *G01D 5/22* (2013.01); *H03K 17/952* (2013.01)

(58) Field of Classification Search
CPC ........ G01D 5/22; H03K 17/952; Y02B 70/10; H02J 7/0042; H05B 45/3725; H05B 45/385; H02M 3/156; H02M 3/158; H02M 3/33507; H02M 1/0009; G01R 27/2611
See application file for complete search history.

(56) References Cited

U.S. PATENT DOCUMENTS

| | | | | |
|---|---|---|---|---|
| 6,307,356 | B1 * | 10/2001 | Dwelley | H02M 3/156 |
| | | | | 323/283 |
| 9,748,852 | B2 | 8/2017 | Freeman et al. | |
| 9,859,793 | B2 * | 1/2018 | Ihs | G05F 1/10 |
| 9,887,624 | B2 | 2/2018 | Hofmann et al. | |
| 9,977,057 | B2 * | 5/2018 | Guthrie | G01R 19/0023 |
| 10,536,068 | B2 | 1/2020 | Anwar et al. | |

(Continued)

FOREIGN PATENT DOCUMENTS

| | | |
|---|---|---|
| CN | 106487234 A | 3/2017 |
| CN | 107681895 A | 2/2018 |

(Continued)

OTHER PUBLICATIONS

Andrei Blinov, et al., Analysis of Fault-Tolerant Operation Capabilities of an Isolated Bidirectional Current-Source DC-DC Converter, Energies, 14 pages, 2019.

*Primary Examiner* — Steven L Yeninas

(57) ABSTRACT

A method can include in a first phase of a sensing operation, controlling at least a first switch to energize a sensor inductance; in a second phase of the sensing operation that follows the first phase, controlling at least a second switch to couple the sensor inductance to a first modulator capacitance to induce a first fly-back current from the sensor inductance, the first fly-back current generating a first modulator voltage at the first modulator capacitance, and in response to the first modulator voltage, controlling at least a third switch to generate a balance current that flows in an opposite direction to the fly-back current at the first modulator node. The first and second phases can be repeated to generate a first modulator voltage at the first modulator capacitance. the modulator voltage can be converted into a digital value representing the sensor inductance. Related devices and systems are also disclosed.

21 Claims, 26 Drawing Sheets

(56) References Cited

U.S. PATENT DOCUMENTS

| | | | |
|---|---|---|---|
| 10,644,659 | B2 | 5/2020 | Choe et al. |
| 10,784,789 | B1 | 9/2020 | Nasir et al. |
| 2011/0149608 | A1 | 6/2011 | Halberstadt |
| 2017/0331371 | A1* | 11/2017 | Parto .................... H02M 3/003 |
| 2020/0076227 | A1 | 3/2020 | Makwana et al. |

FOREIGN PATENT DOCUMENTS

| | | |
|---|---|---|
| CN | 110289755 A | 9/2019 |
| CN | 111555625 A | 8/2020 |
| CN | 111585440 A | 8/2020 |

* cited by examiner (BACKGROUND)

(BACKGROUND)

INDUCTIVE SENSING METHODS, DEVICES AND SYSTEMS

TECHNICAL FIELD

The present disclosure relates generally to proximity sensing systems, and more particularly to inductive sensing systems and methods.

BACKGROUND

Inductive sensors enjoy use in a wide variety of applications. Because inductive sensors rely on electromagnetic induction, they can be preferred for use in more demanding environments, including industrial applications.

FIG. 25 is a schematic diagram of a conventional inductive sensing system 2551. System 2551 can include a balanced Maxwell-Wien bridge having fixed resistances R1 and R3, reference capacitance C2 in parallel with reference resistance R2, and a sensor inductance LX in series with a sense resistance Rix. Nodes A and B of the Maxwell-Wien bridge can be connected to inputs of a differential amplifier. Reference capacitance C2 and reference resistance R2 are usually sets of resistors and capacitors that can be programmed to particular values with digital codes. The Maxwell-Wien bridge can be driven with an alternating current voltage generator (Gen), usually with a sine wave. An output of a differential amplifier can be applied to a zero voltage detector and phase detector, from which a count can be generated.

A sensing process can rely on seeking to maintain the Maxwell-Wien bridge in a balanced state. In a balanced state, a voltage between nodes A and B is zero, and following formulas are true:

$$L_x = R_1 \cdot R_3 \cdot C_2$$

$$Rl_x = \frac{R_3}{R_2} \cdot R_1$$

$$\frac{L_x}{R_{lx}} = R_2 \cdot C_2$$

Sensing with a Maxwell-Wien bridge depends on Knowing the resistance and capacitance values. Further, a measurement accuracy and stability depend on the quality of the capacitance and resistance sets.

Maxwell-Wien bridge sensing is a commonly used in conventional inductive sensing devices.

FIG. 26 is a schematic diagram of another inductive sensing system 2651. System 2651 can create an oscillator with a sensed inductance and use a resulting frequency Fout to derive a value for the inductance. The oscillator is formed with sensor inductance L1, capacitances C1 and C2 and a current limiting resistor R1. Such components are formed "off chip", with a driver, counter, timer and clock generator being part of an integrated circuit (IC) device. A sensor inductance can include a coil resistance RI and parasitic capacitance Ci. Over an Nsample period time, a counter can count a number Fout signal clock pulses. The inductance-to-code transfer function for an ideal system 2651 can be given by:

$$Rawcounts = \frac{1}{2 \cdot \pi} \cdot \sqrt{\frac{2}{C} \cdot \frac{N_{sample}}{F_{clk}}} \cdot \frac{1}{\sqrt{L_1}}$$

As shown, an output code Rawcounts is inversely proportional to a square root of the inductance L1, capacitances C1, C2 and the frequency Fclk.

A drawback to system 2651 can be limited sensing resolution, as sensing is dependent on Fclk. Further, Fout is limited by printed circuit board (PCB) inductor self-resonance frequency and FIMO values. Conversion sensitivity is lower than sensor sensitivity due to the square root dependency in the transfer function. As shown below, changes in Fout frequency are proportionally less than changes in sensor inductance:

$$\delta f_{osc} = 1 - \sqrt{\frac{1}{1 - \frac{\Delta L_s}{L_s}}}$$

if $\frac{\Delta L_s}{L_s} = 0.1\ (10\%)$ $\delta f_{osc} = -5.4\%$

In a system 2651, initial Fout tolerance can be high, due to the tolerances of L1, C1 and C2. For example, a PCB inductor tolerance is typically no better than +−15% and a typical capacitor tolerance is +−10%. In addition, Fout depends on sensor capacitance, especially in high resolution cases. Still further, an impedance of the Driver can impact Fout frequency. The need to address these various features can make the ability to implement multi-sensor scanning difficult. Due to the various tank oscillator components needed per sensor, multi-sensor scanning systems can have a high component count. As a result, an approach like that of system 2651 can be inflexible, and not satisfactory for some applications.

It would be desirable to arrive at some way of implementing sensing inductance with an integrated circuit device that does not suffer from the drawbacks of other approaches, like those noted above.

DETAILED DESCRIPTION

Figure 1A:
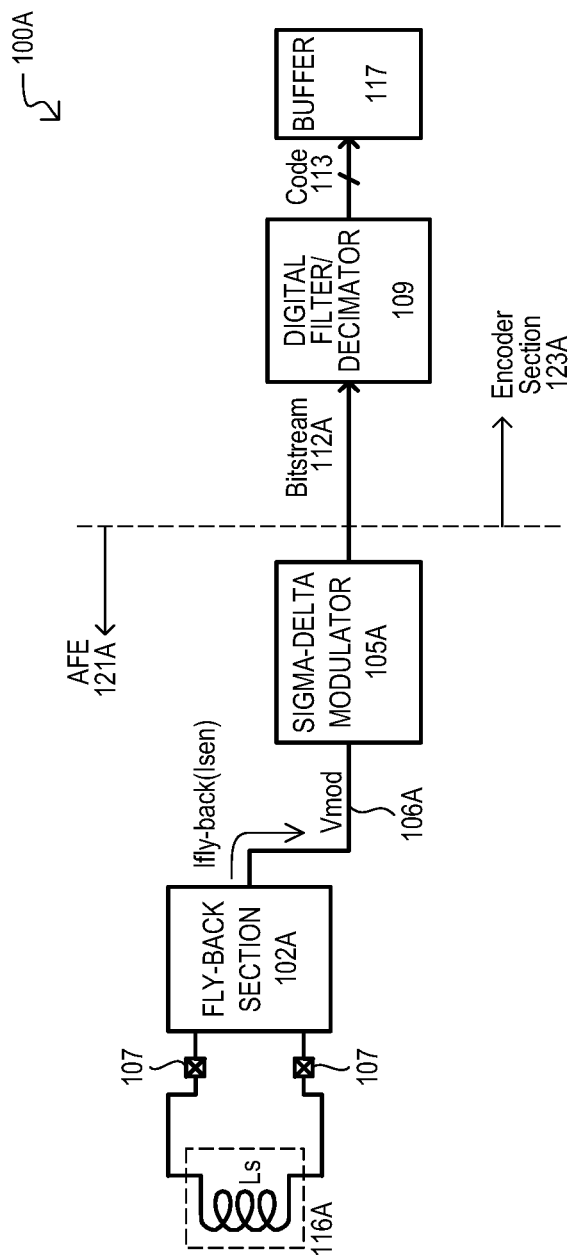
FIG. 1A is a block diagram of an inductive sensing device according to an embodiment.

Embodiments can include inductive sensing methods, devices and systems based on inducing a fly-back current from the sensed inductance. Generation of a fly-back current generally involves two phases. In a first phase, the inductance is coupled to a voltage source to accumulate energy. In a second phase, the inductance is decoupled from the voltage source and coupled to a load. The energy accumulated in the first phase creates an electromotive force (EMF) that produces a fly-back current at the load. The accumulated energy is directly proportional to the inductance.

According to embodiments, inductive sensing can be single ended, generating a fly-back current of one direction that generates a voltage that can be sigma-delta modulated into a digital value.

According to embodiments, inductive sensing can be pseudo-differential, generating a first fly-back current of one direction, and then generating a second fly-back current of another direction. The first and second fly-back currents can generate a differential voltage that can be sigma-delta modulated into a digital value.

According to embodiments, pseudo-differential sensing can include four phases. A first phase can energize a sensed inductance. A second phase can generate a first fly-back current at a first modulator node. A third phase can energize the sensed inductance for a second time. A fourth phase can generate a second fly-back current at a second modulator node having a flow direction opposite to that of the first fly-back current.

According to embodiments, a fly-back current at a modulator node can be balanced by a balance current to optimize sensing response. A balance current can be modulated by the voltage at the modulator node (e.g., via a feedback path). In some embodiments, a balance current can be generated by a switch capacitor circuit. Such a switch capacitor circuit can include a programmable capacitance.

According to embodiments, a fly-back current at a modulator node can be controlled by with a reference current flowing in an opposite direction. In some embodiments, a reference current can be generated by a switch capacitor circuit. Such a switch capacitor circuit can include a programmable capacitance.

In the various embodiments described herein, like items are referred to by the same reference characters, but with the leading digit(s) corresponding to the figure number.

FIG. 1A is a block diagram of an inductive sensing device 100A according to an embodiment. A device 100A can include an analog front end (AFE) 121A and a digital (e.g., encoding) section 123A. AFE 121A can include a fly-back section 102A and sigma-delta modulator 105A, and can be coupled to one or more inductive sensors (one shown as 116A). An inductive sensor 116A can include a sense inductance Ls. In some embodiments, inductive sensor 116A can be coupled to a device 100A by external connections 107. A fly-back section 102A can couple sense inductance Ls to an energizing voltage, and then subsequently couple the sense inductance Ls to a modulator node 106A to generate a fly-back current (Ifly-back). All or a portion of the sense current Isen can generate a voltage (Vmod) on modulator node 106A. Sigma-delta modulator 105A can generate a bitstream 112A from Vmod. Such a bitstream can correspond to a sensed inductance Ls.

A bitstream 112A can be converted into a digital value (code 113) representative of an inductance by digital section 123A. In the embodiment shown, digital section 123A can include a digital filter/decimator 109, which can filter out noise and downsample the modulator results to generate code values 113. Code values 113 can be output and/or stored in a buffer 117, or the like.

Figure 1B:
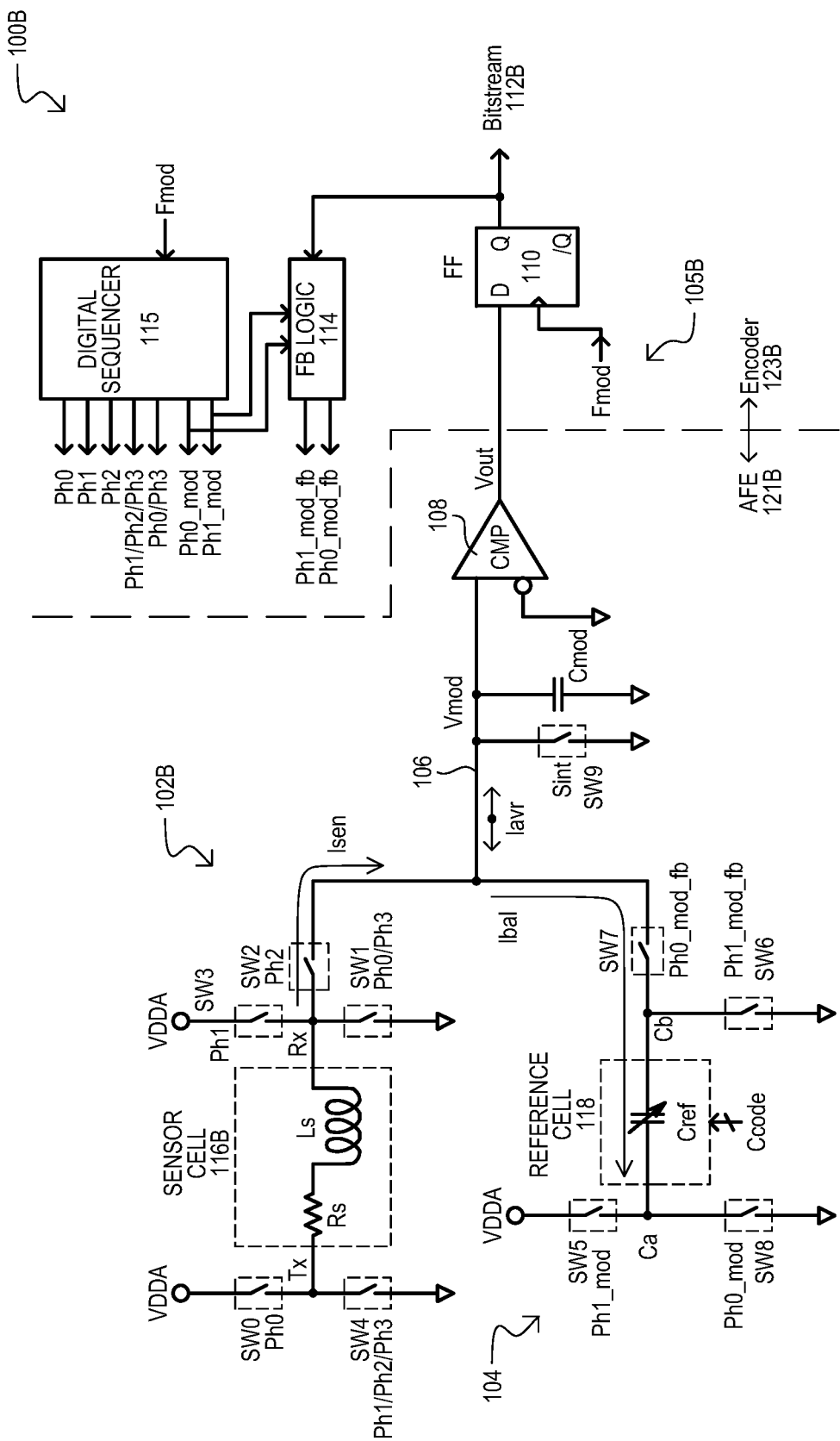
FIG. 1B is a schematic diagram of a single ended inductive sensing device according to an embodiment.

FIG. 1B is a schematic diagram of an inductive sensing device 100B according to another embodiment. A device 100B can include an AFE 121B and encoding section 123B. AFE 121B can include a fly-back section 102B, a sigma-delta modulator 105B, and a balance section 104. Encoding section 123B can include flip-flop (FF) 110, feedback logic 114, and digital sequencer 115. A fly-back section 102B can energize a sensor inductance Ls, that switch voltages across Ls to induce a fly-back current Isen. Fly-back current Isen can vary with sensor inductance Ls. A fly-back section 102B can include analog switches SW0, SW1, SW2, SW3 and SW4, that can be coupled to an inductive sensor 116B (also called sensor cell 116B). In some embodiments such connections can be via external connections (e.g., Tx, Rx) of device 100B. Inductive sensor 116B can include a sense inductance Ls and inductor resistance Rs. Switch SW0 can be controlled by a signal Ph0 to couple a first sensor node (Tx) to a high supply node VDDA. Switch SW1 can be controlled by signals Ph0/Ph3 to couple a second sensor node (Rx) to a low supply node (ground). Switch SW2 can be controlled by signal Ph2 to couple Rx to a modulator node 106. Switch SW3 can be controlled by signal Ph1 to couple Rx to VDDA. Switch SW4 can be controlled by signals Ph1/Ph2/Ph3 to couple Tx to ground.

A balance section 104 can be a switched capacitor (SC) circuit which can charge a capacitance (Cref) via one node (Ca), then switch the voltage at the node to induce a balance current (Ibal). A balance section 104 can include analog switches SW5, SW6, SW7, and SW8. A balance section 104 can include (or be coupled to) a reference cell 118 which can include variable capacitance Cref. Reference cell 118 can have nodes Ca and Cb. A capacitance value of Cref can be established with value Ccode, which can be a digital value in some embodiments. SW5 can be controlled by a signal Ph1_mod to couple Ca to a high supply node VDDA. SW6 can be controlled by a signal Ph1_mod_fb to couple Cb to ground. SW7 can be controlled by a signal Ph0_mod_fb to couple Cb to modulator node 106. SW8 can be controlled by signal Ph0_mod to couple Ca to ground.

Sigma-delta modulator 1056 can include modulator capacitance Cmod, switch SW9, comparator 108, and flip-flop FF 110. SW9 can be controlled to couple modulator node 106 to ground. Cmod can be coupled between modulator node 106 and ground and can be charged and discharged to generate a modulator voltage Vmod. Comparator 108 can have a first (non-inverting) input coupled to modulator node 106, and a second (inverting) input coupled to ground.

An output of comparator 108 Vout can be coupled to a "D" input of FF 110. FF 110 can be enabled by a clock signal Fmod. An output (Q) of FF 110 can thus provide a sigma-delta modulated bitstream 112B having a duty cycle that varies with Vmod. Vmod can vary according to Isen, which can vary according to Ls. In this way, bitstream 112B can represent Ls.

Digital sequencer 115 can generate signals Ph0, Ph1, Ph2, Ph3 and combinations thereof (e.g., Ph1/Ph2/Ph3 and Ph0/Ph3). In addition, digital sequencer 115 can generate signals Ph0_mod and Ph1_mod. In the embodiment shown, such signals can be synchronous with Fmod. Feedback logic 114 can generate non-overlapping signals Ph0_mod_fb and Ph1_mod_fb in response to bitstream 112B and signals Ph0_mod and Ph1_mod, respectively. In the embodiment shown, while Ph0_mod_fb and Ph1_mod_fb can be synchronous with Fmod, in other embodiments such signals can have different timing.

While the embodiments herein show sensor inductances that can be energized with particular supply voltages (e.g., VDDA, VDDA/2) such particular supply voltages should not be construed as limiting. Embodiments can energize a sensor inductance with any suitable supply voltage, including voltages stepped down from a power supply voltage and/or voltages boosted above a power supply voltage (e.g., Vbe).

To better understand features and advantages of the disclosed embodiments, elements of inductive sensing will be described.

A typical printed circuit board (PCB) inductor can have an inductance of tens of microhenrys and tens of ohms resistance. A time constant of an inductor is given by:

$$\tau = \frac{L_s}{r_s}$$

In equivalent circuits, the $r_s$ value can include the sensor inductance resistance (Rs) and analog switches resistances (Rsw). Typically, the analog switch resistance can be equal to or higher than Rs.

Figure 2:
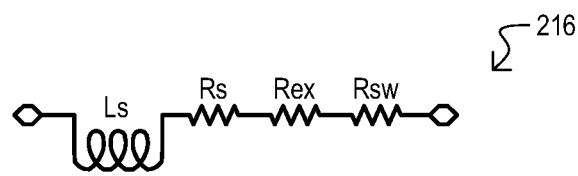
FIG. 2 is a schematic diagram representation of an inductive sensor current path that can be included in embodiments.

FIG. 2 is a schematic diagram equivalent of an inductive sensor current path 217. The current path 217 can include sensor inductance (Ls), inductor resistance (Rs), additional external resistance (Rex). As a result, a time constant for the inductive sensor can be given by:

$$\tau = \frac{L_s}{R_s + R_{ex} + R_{sw}}$$

A sensor saturation current Isat, can be given by:

$$Isat = \frac{V_{DDA}}{\sum R_i}$$

where $\sum R_i = R_s + R_{sw} + R_{ex}$

According to embodiments, Rex can be used to reduce a sensor saturation current. However, increasing total current loop resistance in the sensing path is undesirable. If sensor inductance (Ls) is low and loop resistance (Rs+Rsw+Rex) is high, the time constant can become lower than a system clock frequency. This can restrict a converter operating period.

According to embodiments, a three point sensor connection can be used to advantageously include Rex in inductor energizing operations, to thereby reduce Isat, while excluding Rex from sensing operations, and thereby provide an advantageously lower time constant for the sensed inductance.

Figure 3:
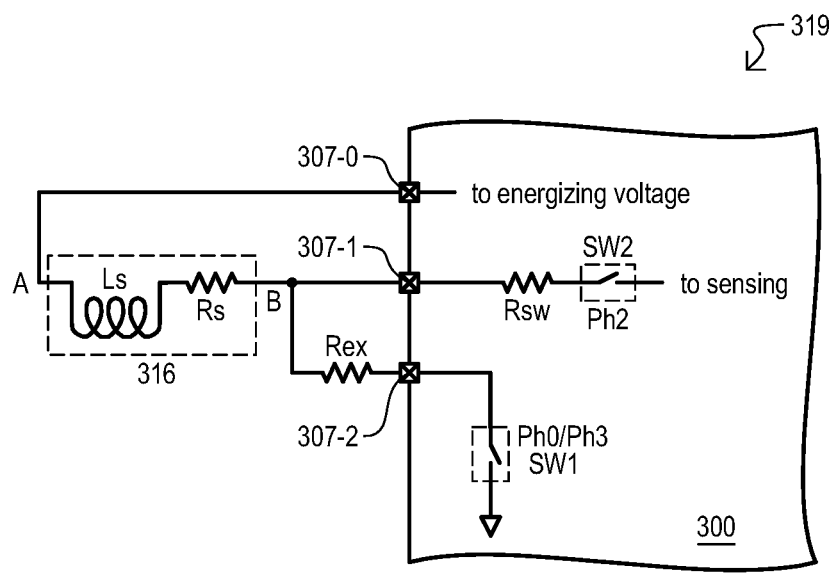
FIG. 3 is a schematic diagram of a three-point sensor connection according to an embodiment.

FIG. 3 is a schematic diagram of a three point sensor connection 319 according to an embodiment. FIG. 3 shows an inductive sensor 316 and a sensing device 300, which in some embodiments can be an integrated circuit (IC) device. Inductive sensor 316 can have a first terminal (A) coupled to a first connection 307-0 of device 300. A second terminal (B) can be coupled to a second connection 307-1 and to a third connection 307-2. The connection to third connection 307-2 can include resistance Rex, which can make it a higher resistance path than that to second connection 307-1.

Device 300 can include a sense path analog switch SW2 (which can introduce a resistance Rsw) and an energize path analog switch SW1. Typically, a pull-up or pull-down switch (i.e., SW1) can have a lower resistance than an analog MUX switch (i.e., SW2). In an energize operation, SW1 can be enabled and SW2 disabled, coupling sensor terminal B to ground (sensor terminal A can be coupled to an energizing voltage). As a result, Rex can affect a resulting Isat value. In contrast, in a sensing operation, in which a fly-back current is induced, SW1 can be disabled and SW2 enabled. As a result, a fly-back current (which flows through SW2) is not subject to Rex, providing a lower current loop resistance and thus an advantageously smaller time constant τ.

FIGS. 4A to 4D are a series of diagrams showing sensing phases for inductive sensing according to embodiments, including that shown in FIG. 1B. According to embodiments, inductive sensing can involve a number of phases, which can include switching configurations to inductive sensor terminals to generate a fly-back current to vary a voltage at a modulator capacitance. FIGS. 4A to 4D show a fly-back section 402, which can have connections to terminals (A and B) of inductive sensor 416. Inductive sensor 416 can have an inductance Ls and resistance Rs.

Figure 4A:
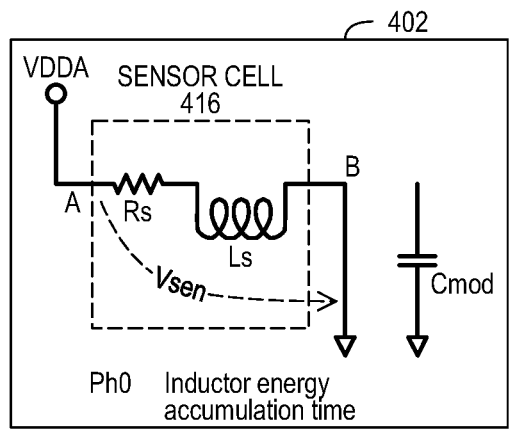
FIGS. 4A to 4D are a sequence of diagrams showing different phases of an inductance sensing operation according to an embodiment.

FIG. 4A shows a first phase (Ph0), which can be an energizing phase. In Ph0, by operation of one or more switches (e.g., SW0 and SW1), terminal A can be coupled to an energizing voltage, which in the embodiment shown, can be a high power supply node VDDA. At the same time, terminal B can be coupled to a low power supply node (ground). A voltage (Vsen) across sensor 416 can energize inductor Ls.

Figure 4B:
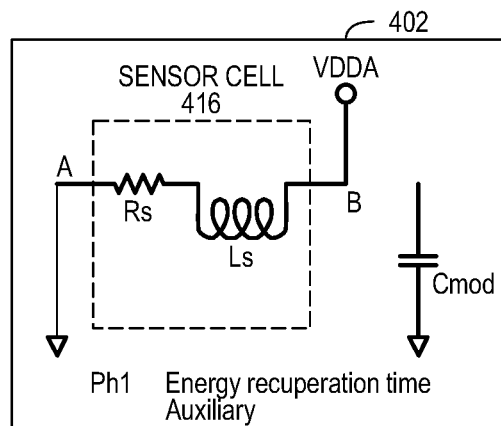

FIG. 4B shows a second phase (Ph1), which can be an optional energy recuperation phase. In Ph1, by operation of switches (e.g., SW3 and SW4), terminal A can be coupled to a low power supply node, while terminal B can be coupled to a higher voltage node (in this case VDDA). Ph1 can be used to reduce subsequent fly-back current from Ls, if necessary. If Ph1 is omitted, a sensing operation can go from a first phase (Ph0) to a third phase (Ph2).

Figure 4C:
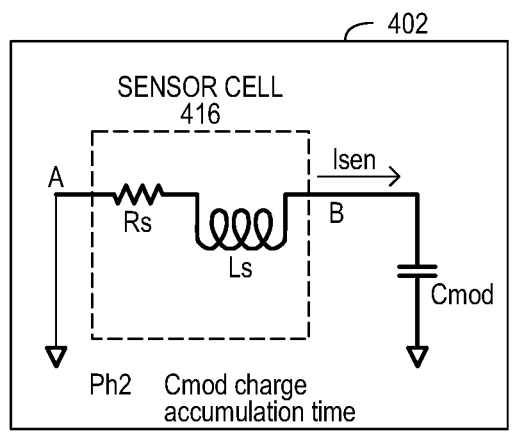

FIG. 4C shows a third phase (Ph2), which can be a charge accumulation phase. In Ph2, by operation of switches (e.g., SW2 and SW4), terminal B can be coupled to a modulator capacitance (Cmod) and terminal B can be coupled to a potential that can induce a fly-back current from Ls, which is a lower power supply node in the embodiment shown. Due to fly-back current (Isen), charge can accumulate on Cmod. A resulting voltage on Cmod can be modulated to determine Ls. A duration of Ph2 can control a sensing signal-to-noise ratio (SNR).

Figure 4D:
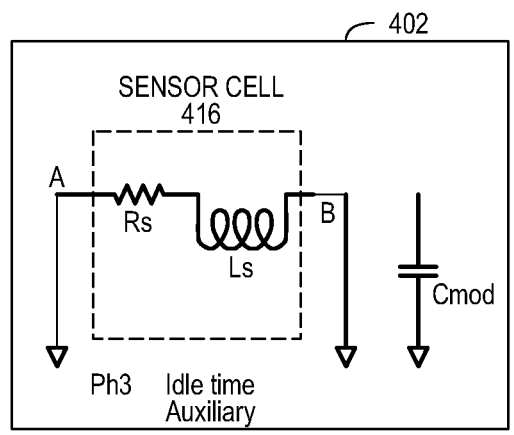

FIG. 4D shows a fourth phase (Ph3), which can be an optional idle phase. In Ph3, by operation of switches (e.g., SW1 and SW4), terminals A and B can both be coupled to a low power supply node. Ph3 can discharge any remaining energy in Ls. Accordingly, Ph3 can be used to control sensing frequency, and can influence power consumption and a balance condition a modulator node (i.e., Cmod). After Ph3, a sensing operation can return to Ph0, to repeat the sequence. If Ph3 is omitted, a sensing operation can go from Ph2 to Ph0 to repeat the sequence.

The various sensing phases can generate a voltage on Cmod that can be sigma-delta modulated to create a bitstream that can be sampled to arrive at sensed inductance values.

Figure 5:
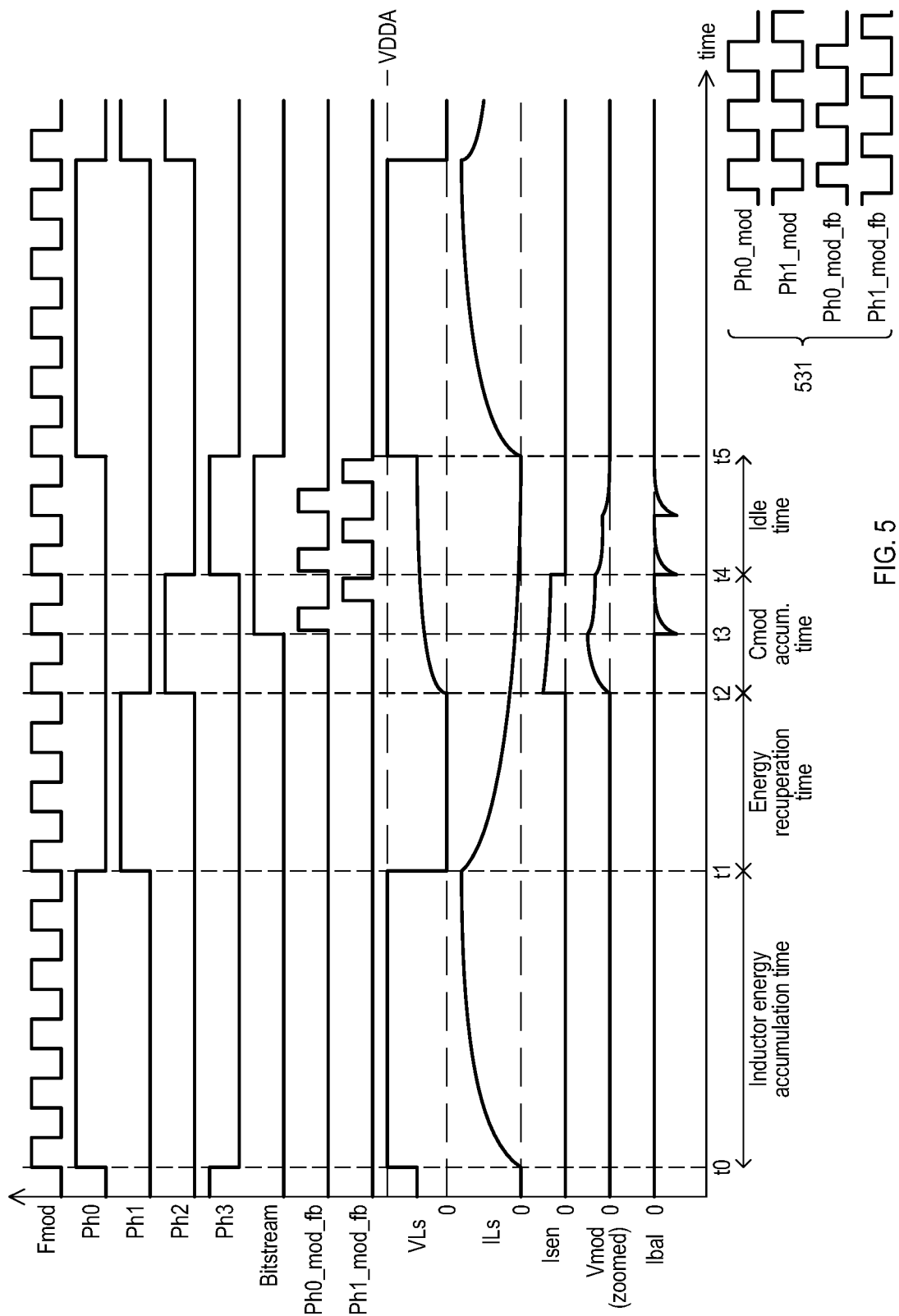
FIG. 5 is a timing diagram showing a single ended inductance sensing operation according to an embodiment.

Referring to FIG. 5, a timing diagram is shown for operations of device 100B shown in FIG. 1B. The timing diagram shows: modulation clock Fmod; the various sensing phases Ph0, Ph1, Ph2 and Ph3; a resulting bitstream (Bitstream); feedback signals Ph0_mod_fb, Ph1_mod_fb; an inductor voltage VLs; an inductor current ILs; a resulting sensed current Isen; a modulation voltage Vmod; and a balance current Ibal.

At time t0, Ph0 can begin. SW0 and SW1 can close, placing VDDA across a sensor inductance (Ls), thereby energizing Ls.

At time t1, Ph0 can end and Ph1 can begin. SW0 and SW1 can open, while SW3 couples node Rx to VDDA and SW4 couples node Tx to ground. A voltage across the Ls can switch, and Ls can start to de-energize.

At time t2, Ph1 can end and Ph2 can begin. SW3 can open and SW2 can couple node Rx to modulator node 106. As a result, a fly-back current can be generated by Ls. The fly-back sense current can flow to modulator node 106 by operation of SW2 to generate a modulator voltage Vmod. In the embodiment shown, Isen can be a source current to modulator node 106.

At time t3, which occurs during Ph2, due to Vmod, an output of comparator 108 Vout can be driven high. This can trigger FF 110 to drive output Q (i.e., Bitstream 112B) high. A high Bitstream 112B can be received by feedback logic 114. In response, feedback logic 114 can generate pulse Ph0_mod_fb followed by pulse Ph1_mod_fb. Pulse Ph0_mod_fb can result in a balance current Ibal by switched capacitor operation of Cref. As shown, Ibal can be a sink current from modulator node 106, which can reduce Vmod. Subsequently, Cref can be charged by operation of switches SW5 and SW6. Provided Bitstream 112B remains high, current Ibal can continue to be generated.

At time t4, Ph2 can end and Ph3 can begin. SW2 can open, ending any charging of modulator node 106 by fly-back current Isen. By operation of SW4 and SW1, both nodes Tx and Rx of inductive sensor 116B can be coupled to ground. In the embodiment shown, Vmod continues to drive Bitstream high, thus Ph0_mod_fb and Ph1_mod_fb can continue, generating an Ibal current that continues to drive Vmod toward zero volts.

At time t5, a subsequent Ph0 can start, and the detection process can repeat.

Waveforms 531 show how signals Ph0_mod_fb and Ph1_mod_fb can be generated in relation to signals Ph0_mod and Ph1_mod. Such waveforms are provided by way of example and should not be construed as limiting. Further, as noted herein, while FIG. 5 shows pulses Ph0_mod_fb and Ph1_mod_fb that are synchronous with Fmod, such timing should not be construed as limiting.

Figure 26:
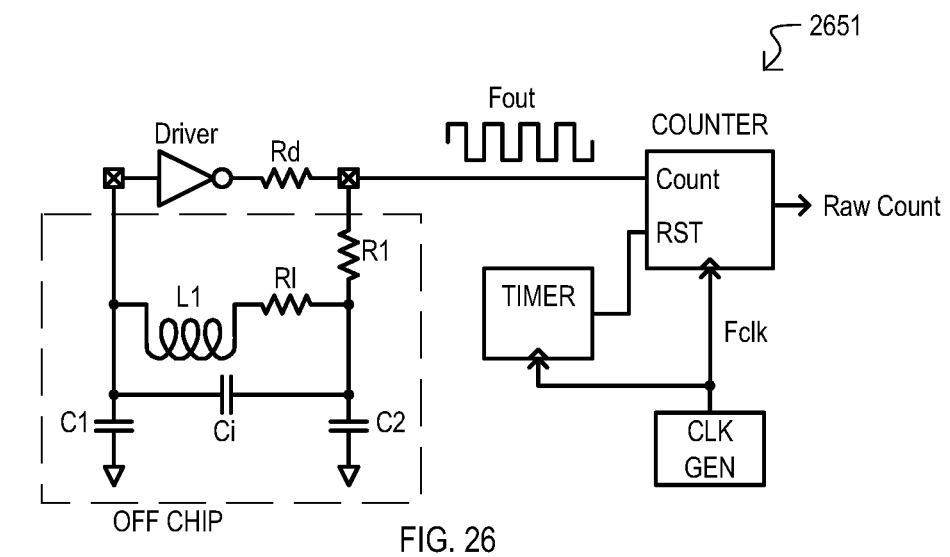
FIG. 26 is a block diagram of another conventional inductance sensor.

In inductance sensing operations according to embodiments, a total charge accumulated by a modulator capacitance (Cmod) can be calculated by the formula:

$$Q_{ph2} = \frac{V_{DDA}}{\Sigma R_i^2} \cdot L_s \cdot \left(1 - e^{-T_{ph2} \cdot \frac{\Sigma R_i}{L_s}}\right)$$

where Tph2 is the duration of a charge accumulation period Ph2. In the above formula, the following is assumed: a total sensor resistance does not change in the sensor excitation phases; a Ph1 phase is not included; a Cmod capacitance value is high enough so that voltage drop during charge transfer period (e.g., Ph2) is negligible; and a sensor capacitance (e.g., Ci in FIG. 26) does not influence sensing.

For embodiments like that of FIG. 1B and FIG. 5, a balancing process (e.g., generation of a balancing current) can be designed to move a Vmod voltage back to zero after it has been generated by a sensor inductance fly-back current. A balancing process can operate during a charge accumulation (i.e., sampling) period. An accumulated charge at Cmod can be balanced by a switched capacitor current Ibal. A balanced condition can be given by:

$$Q_{ph2\_max} < V_{DDA} \cdot C_{ref} \cdot N_{b\_min}$$

$Q_{ph2\_max}$ can be the maximal charge that can be produced in a sensor excitation cycle (e.g., Ph2). Nb_min can be the minimal required amount of Fmod cycles to reach a balance. Nb_min value can thus define a maximal sensor excitation frequency $F_{s\_max}$. This frequency is calculated by the formula:

$$F_{s\_max} = \frac{F_{mod}}{N_{b\_min}}$$

In a Ph3 period, both terminals of the sensor inductance can be coupled to ground after the Ph2 period. If the balancing period duration is longer than the sensor excitation phase duration:

$$\frac{1}{F_s} > T_{ph0} + T_{ph1} + T_{ph2} + T_{ph3}$$

The inductance-to-code transfer function can be:

$$DC = \frac{1}{\Sigma R_i^2 \cdot C_{ref} \cdot N_b} \cdot L_s \cdot \left(1 - e^{-T_{ph2} \frac{\Sigma R_i}{L_s}}\right)$$

It is noted that the above function demonstrates various advantages of a fly-back sensing approach according to embodiments: conversion results, a digital code (DC) are proportional to the sensor inductance (Ls); conversion results are time dependent on a sampling period (Tph2). It is also noted that a sensor resistance (Rs included in Ri) and Cref do not depend on a power supply voltage VDDA.

While the above conversion appears to be non-linear with respect to Ls, this non-linearity does not greatly affect a typical sensing operation. For many applications sensed inductance variations are in a relatively narrow range. For example, many inductance sensing operations detect inductance variations of lower than 20% (e.g., +−10%). In this inductance variation range, the non-linearity has almost no effect. For example, if a Ph2 period duration is about three times the time constant, the approximate formula becomes:

$$DC = \frac{1}{\Sigma R_i^2 \cdot C_{ref} \cdot N_b} \cdot L_s$$

$$\text{if } T_{ph2} \approx 3 \cdot \frac{L_s}{\Sigma R_i}$$

This transfer function is linear with respect to inductance Ls. In this way, fly-back inductive sensing devices according to embodiments can generate code values that vary linearly with inductance changes. This is in sharp contrast to conventional approaches.

Figure 6:
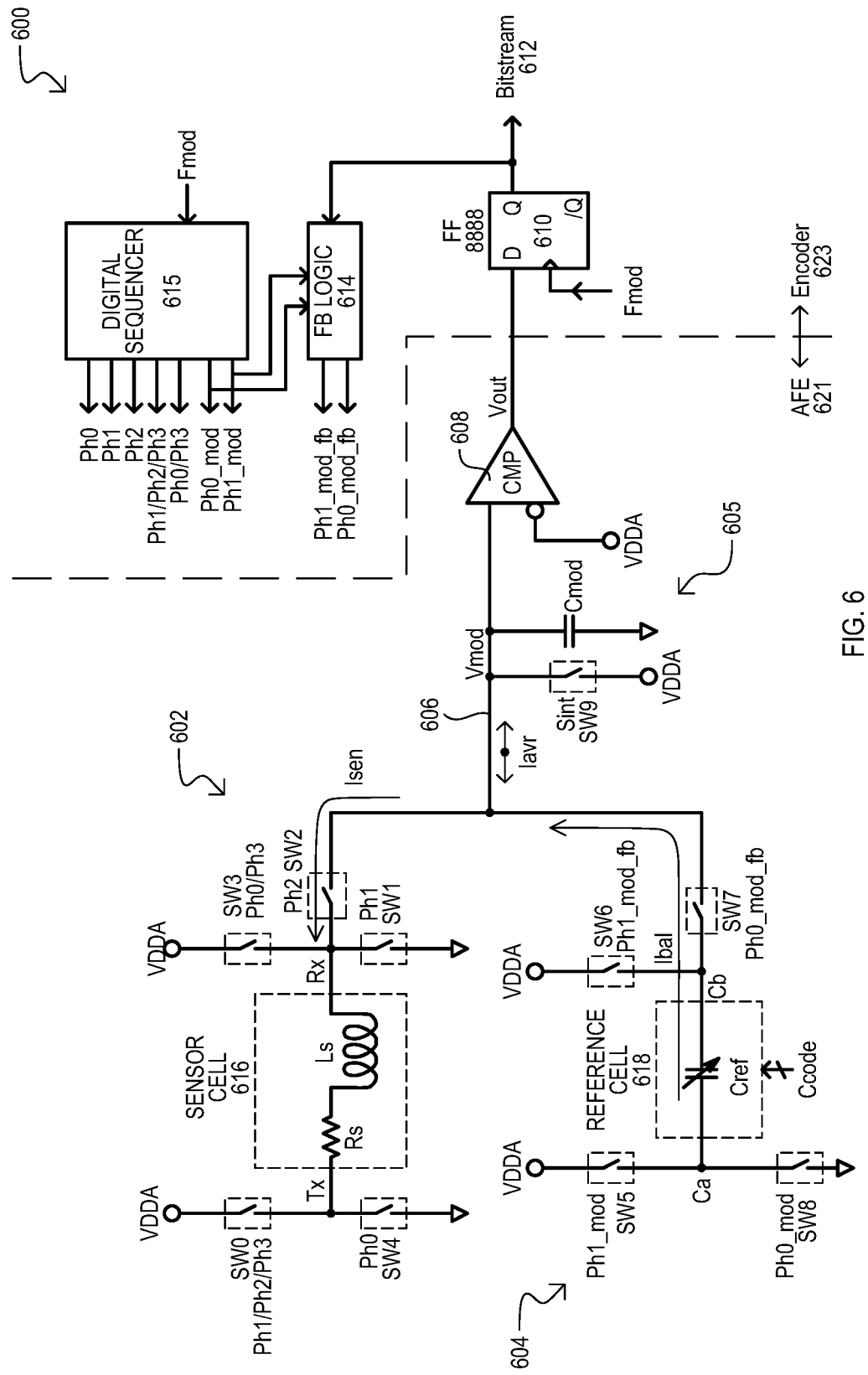
FIG. 6 is a schematic diagram of a single ended inductive sensing device according to another embodiment.

While embodiments can seek to modulate an inductance related voltage (Vmod) at around a zero volt level, other embodiments can generate modulation voltages around other voltage levels. FIG. 6 shows such an embodiment.

FIG. 6 shows an inductance sensing device 600 according to another embodiment. Inductance sensing device 600 can include items like those of FIG. 1B, which can operate in a like fashion.

The embodiment FIG. 6 differs from FIG. 1B in that modulator node 606 can be driven back to VDDA, after a Vmod voltage lower than VDDA is generated by a fly-back current, and a fly-back section 602 can draw (i.e., sink) a fly-back sense current (Isen) from modulator node, SW9 can couple modulator node 606 to VDDA and a non-inverting input of comparator 608 can be coupled to VDDA. Correspondingly, a balance section 604 can generate a balance current (Ibal) that is a source current to modulator node 606.

FIGS. 7A to 7D are a series of diagrams showing sensing phases for inductive sensing according to other embodiments, including that shown in FIG. 6.

Figure 7A:
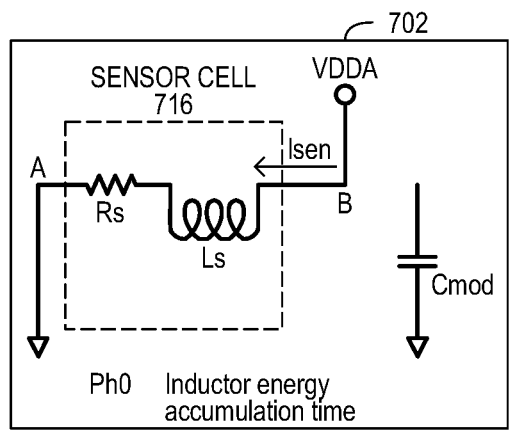
FIGS. 7A to 7D are a sequence of diagrams showing different phases of an inductance sensing operation according to another embodiment.

FIG. 7A shows an energizing phase Ph0. By operation of one or more switches (e.g., SW3 and SW4), terminal B can be coupled to an energizing voltage VDDA. At the same time, terminal A can be coupled to ground.

Figure 7B:
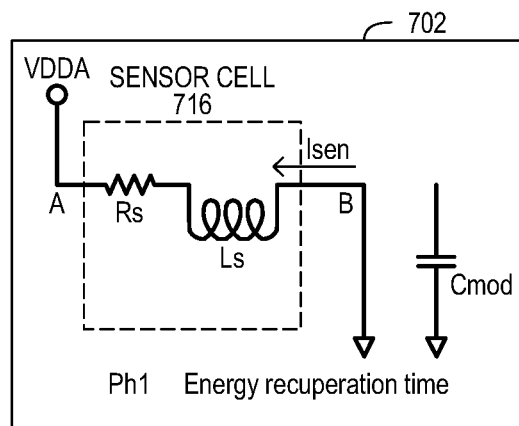

FIG. 7B shows an optional energy recuperation phase (Ph1). By operation of switches (e.g., SW0 and SW1), terminal A can be coupled to VDDA, while terminal B can be coupled to ground.

Figure 7C:
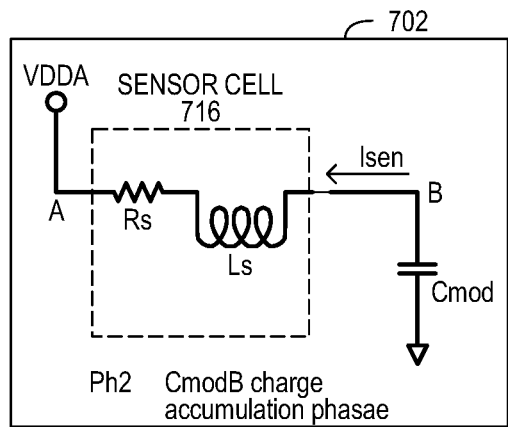

FIG. 7C shows a charge accumulation phase Ph2. By operation of switches (e.g., SW0 and SW2), terminal B can be coupled to generate a fly-back current on modulator capacitance (Cmod). Due to the fly-back current (Isen), charge can be discharged at Cmod. A resulting voltage on Cmod can be modulated to determine Ls.

Figure 7D:
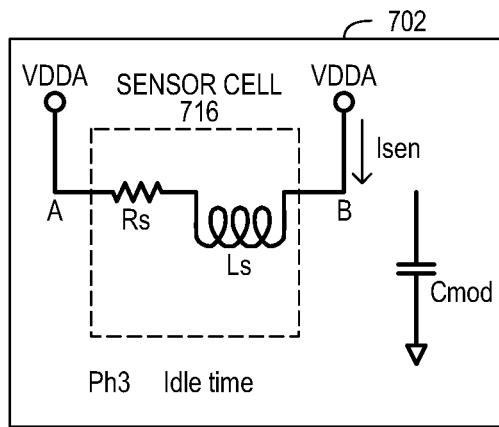

FIG. 7D shows an optional idle phase Ph3. By operation of switches (e.g., SW0 and SW3), terminals A and B can be coupled to VDD.

The embodiments of FIGS. 1B and 6 can generate a switched capacitor balance current (Ibal) by operation of a balance section (e.g., 104, 604). A balance section can include four analog switches and an adjustable capacitance Cref. A capacitance Cref can be set with a digital code Ccode. Switches that couple nodes Ca and Cb to power supply nodes (e.g., SW5, SW6, SW8) can be open drain pull-up/pull-down drivers. A switch that couples node Cb to a modulator node (e.g., 106, 606) can be an analog switch with low switching injection current. Two-phase, non-overlapping signals (Ph0_mod_fb, Ph1_mod_fb) can control Ibal. In some embodiments, a Fmod modulator clock frequency can define this sequence. Further, the sequence is modulated by a convertor output Bitstream signal (e.g., 112B, 612). An average current produced by a balanced section (e.g., 106, 606) can be given by:

$$I_{bal} = \pm C_{ref} \cdot V_{dda} \cdot f_{mod} \cdot DC$$

where DC is an average duty cycle of a Bitstream signal.

The above formula assumes that a modulator capacitance (Cmod) is sufficiently high enough that voltage drop during charge transfer period is negligible. When a modulator voltage (Vmod) is at a comparator threshold voltage (e.g., ground in FIG. 1B or VDDA in FIG. 6), the inductance converting device 1006/600 can be considered to be in a balanced operating point.

Figure 8:
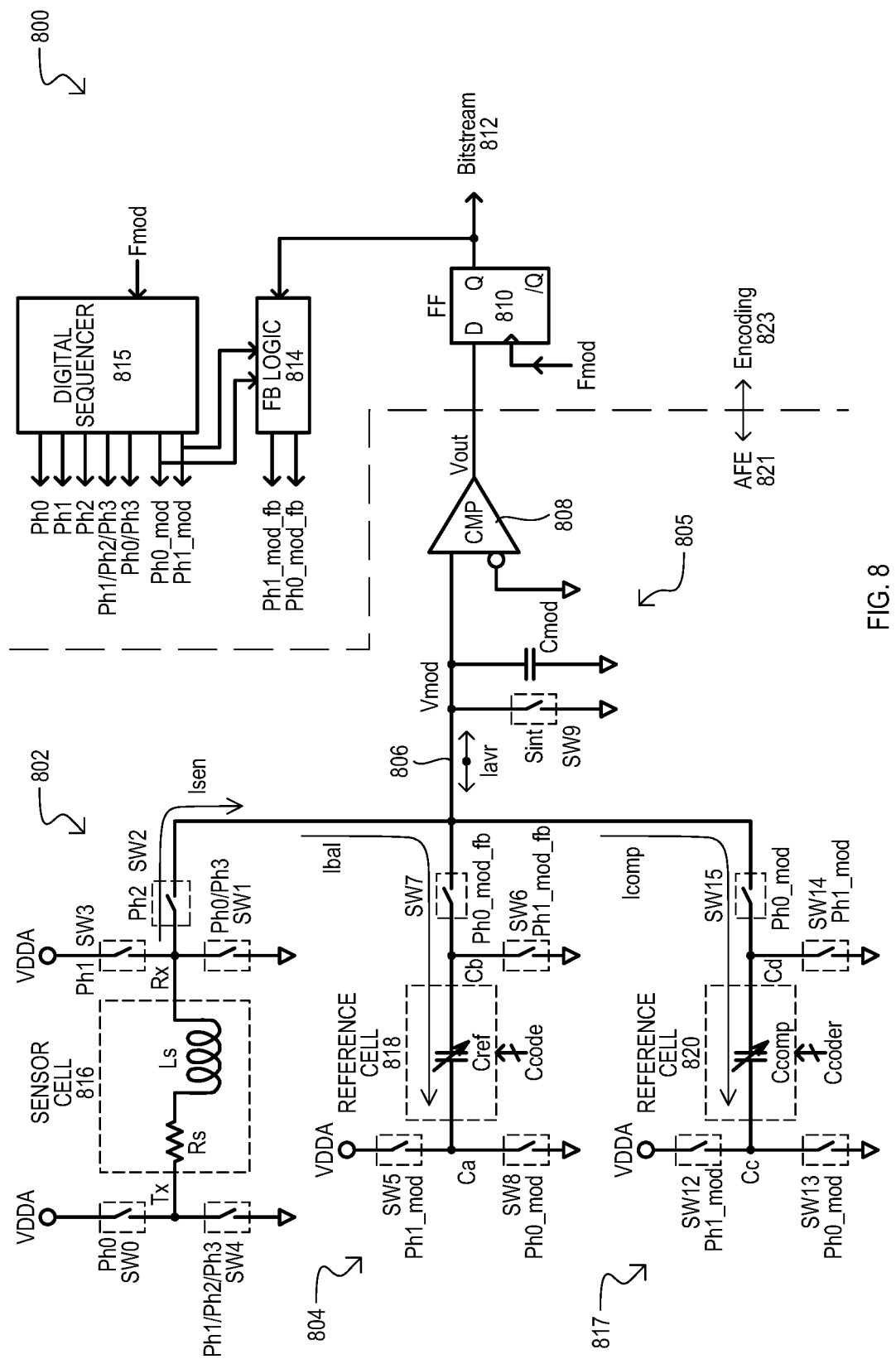
FIG. 8 is a schematic diagram of a single ended inductive sensing device that utilizes a compensation current according to an embodiment.
Figure 9:
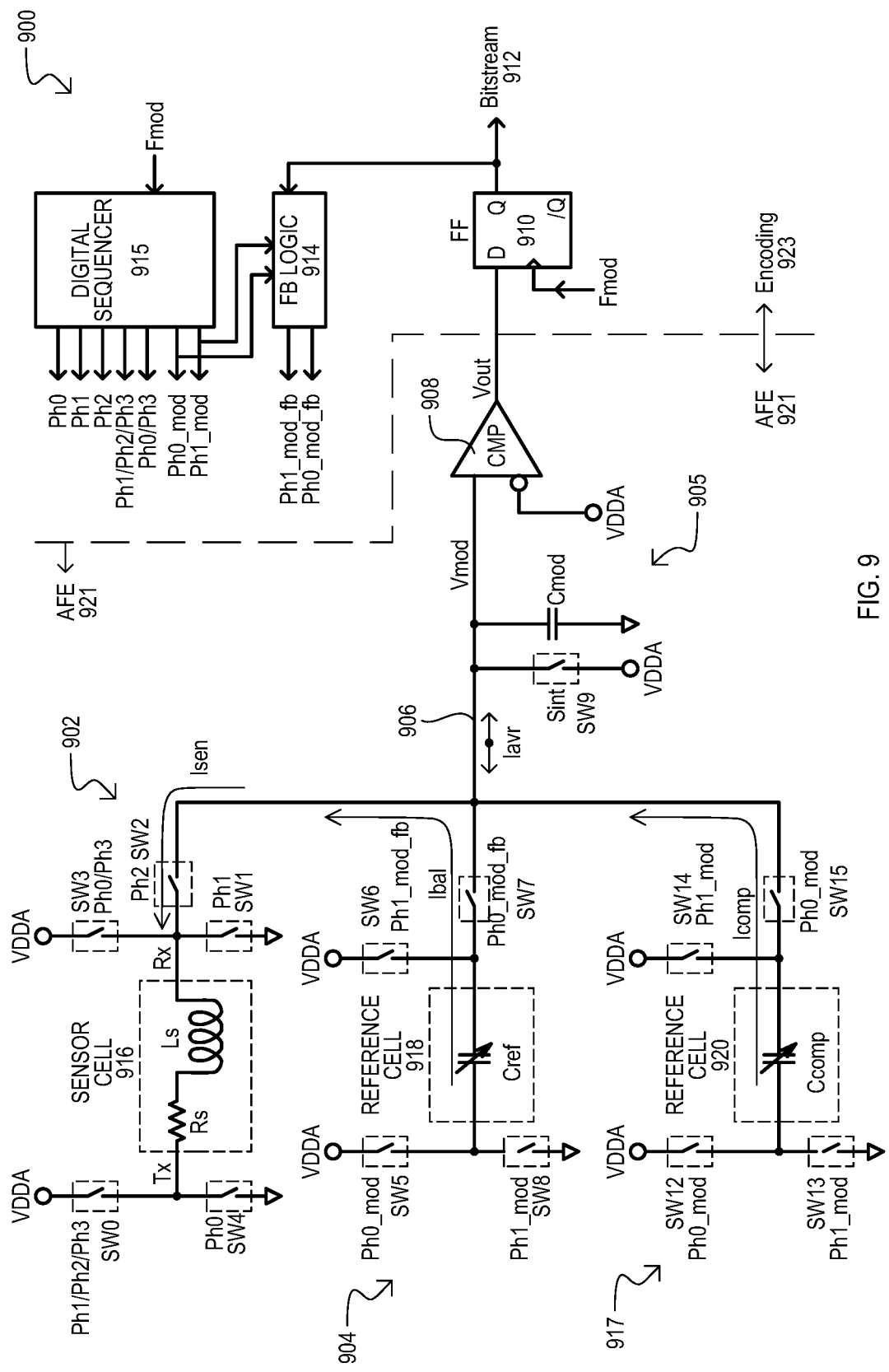
FIG. 9 is a schematic diagram of a single ended inductive sensing device that utilizes a compensation current according to another embodiment.

In some sensor ranges and sensitivities, a balance current (Ibal) generated in response to a modulator output (Bitstream) can provide a desired response. However, for some sensor ranges and/or sensitivities it may be desirable to generate an additional current to balance the fly-back current (Isen) at the modulator node. FIGS. 8 and 9 are schematic diagrams of such embodiments.

FIG. 8 shows an inductance sensing device 800 according to another embodiment. Sensing device 800 can include items like those of FIG. 1B, which can operate in a like fashion. This includes a balance section 804 having a reference capacitance Cref that can be set by a value Ccode. The embodiment FIG. 8 differs from FIG. 1B in that an additional compensation section 817 can be included that can generate a compensation current Icomp that can be used to help maintain a balanced state at the modulator node 806.

A compensation section 817 can take the same general form as a balance section 804 and can include analog switches SW12-SW15. A compensation section 817 can include (or be coupled to) a variable capacitance Ccomp at nodes Cc and Cd. A value of Ccomp can be established with value Ccoder (where Ccoder is different than Ccode used on balance section 804). SW12 can be controlled by a signal Ph1_mod to couple Cc to VDDA. SW13 can be controlled by a signal Ph0_mod to couple Cc to ground. SW14 can be controlled by a signal Ph1_mod to couple Cd to ground, and SW15 can be controlled by signal Ph0_mode to couple Cd to modulator node 806.

A compensation section 817 can operate in the same general fashion as a balancing section (e.g., 104, 604). However, generation of the current is not modulated by Bitstream 812. The average current that produces balanced schematic is calculated by formula:

$$I_{comp} = \pm C_{comp} \cdot V_{dda} \cdot f_{mod}$$

It is understood that while the embodiment uses the Fmod clock frequency (shown as $f_{mod}$) for the generation of Icomp, such an arrangement is not limiting. Any suitable switched capacitor timing can be used based on the capacitance Ccomp, desired Icomp, and desired transient response.

FIG. 9 shows a sensing device 900 according to another embodiment. Sensing device 900 can include items like those of FIG. 6, which can operate in a like fashion. The embodiment FIG. 9 differs from FIG. 6 in that it can include a compensation section 917 that generates a compensation current Icomp. Compensation circuit 914 can operate in the same general fashion as FIG. 8, the generated switched capacitor reference current Icomp can source modulator node 906 to oppose the sink Isen current.

Embodiments such as those shown in FIGS. 1B, 6, 8 and 9 have a single-ended configuration, generating a modulator voltage Vmod that can vary from static reference voltage (e.g., VDDA, ground). However, alternate embodiments can include pseudo-differential sensing. A pseudo-differential inductance-to-code convertor according to some embodiments can be conceptualized as combining two single-ended configurations as described above. Pseudo-differential inductance sensing can include eight operating phases, Ph0 to Ph7. Ph0 and Ph4 can be inductor energy accumulation periods. Ph1 and Ph5 can be optional inductor energy recuperation periods. Ph2 and Ph6 can be modulator node charge accumulation periods. Ph3 and Ph7 can be optional idle periods.

Figure 10A:
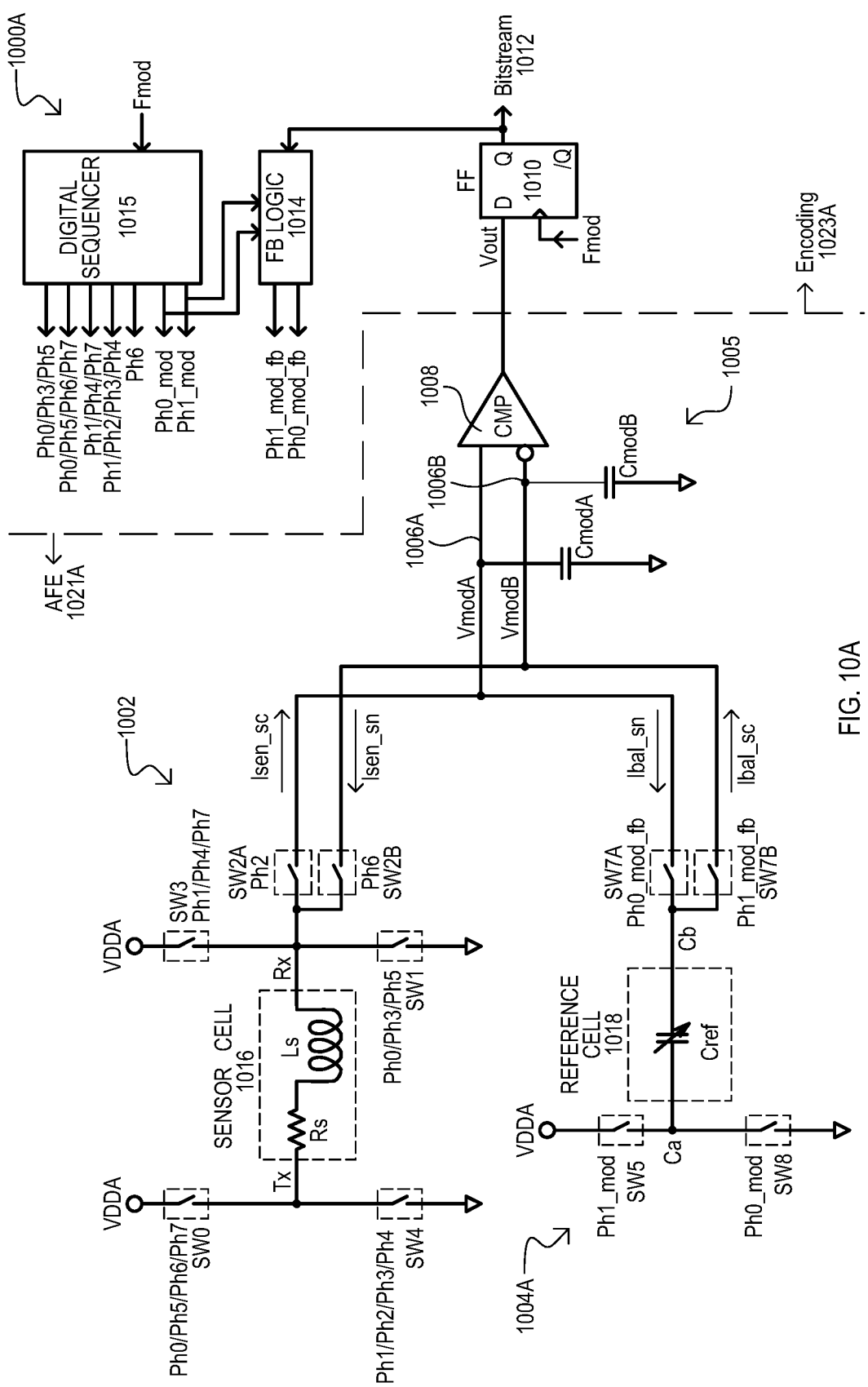
FIG. 10A is a schematic diagram of a pseudo-differential inductive sensing device according to an embodiment.

FIG. 10A is a schematic diagram of an inductive sensing device 1000A that utilizes pseudo-differential sensing according to an embodiment. A device 1000A can include sections like those of FIG. 1B, including a fly-back section 1002, balance section 1004A, modulator section 1005, digital sequencer 1015 and feedback logic 1014.

A fly-back section 1002 can differ from that of FIG. 1B in that it can include switches SW2A and SW2B which can couple terminal Rx of sensor cell 1016 to modulator nodes 1006A and 1006B, respectively. Further, a fly-back section 1002 can operate according to an eight phase inductive sensing operation, as noted above. Switch SW0 can be controlled by a signals Ph0/Ph5/Ph6/Ph7 to couple first sensor node Tx to VDDA. Switch SW1 can be controlled by signals Ph0/Ph3/Ph5 to couple sensor node Rx to ground. Switch SW3 can be controlled by signals Ph1/Ph4/Ph7 to couple Rx to VDDA. Switch SW4 can be controlled by signals Ph1/Ph2/Ph3/Ph4 to couple Tx to ground. SW2A can be controlled by signal Ph2 to couple Rx to modulator node 1006A. SW2B can be controlled by signal Ph6 to couple Rx to modulator node 1006B.

A balance section 1004A can differ from that of FIG. 1B in that it can include analog switches SW5, SW7A, SW7B and SW8. SW5 can be controlled by a signal Ph1_mod to couple Ca to VDDA. SW8 can be controlled by a signal Ph0_mod to couple Ca to ground. SW7A can be controlled by a signal Ph0_mod_fb to couple Cb to modulator node 1006A. SW7B can be controlled by a signal Ph1_mod_fb to couple Cb to modulator node 1006B. A balance section 1004A can generate a first balance current Ibal_sn that sinks current from modulator node 1006A in Ph2 of a sensing operation, and can generate a second balance current Ibal_sc that sources current to modulator node 1006B in Ph6 of a sensing operation. As in the embodiments above, such balance currents (Ibal_sn, Ibal_sc) are dependent upon modulator output bitstream 1012.

A modulator section 1005 can differ from that of FIG. 1B in that a first modulator node 1006A can be coupled to a non-inverting input of comparator 1008, while a second modulator node 1006B can be coupled to an inverting input of comparator 1008. Modulator node 1006A can have a first modulator capacitance CmodA. Modulator node 1006B can have a second modulator capacitance CmodB.

Digital sequencer 1015 can generate the various signals for controlling device 1000 according to the eight-phase sensing sequence. Feedback logic 1014 can generate feedback signals Ph0_mod_fb and Ph1_mod_fb as described herein and equivalents.

In operation, pseudo-differential inductive sensing device 1000 can seek to maintain a common mode voltage at inputs of comparator 1008 at VDDA/2. Accordingly, embodiments can include initializing and/or equalizing circuits that precharge inputs to comparator 1008 to VDDA/2. Balancing section 1004 can be designed to maintain a differential voltage between modulator inputs VmodA and VmodB at zero volts.

Figure 10B:
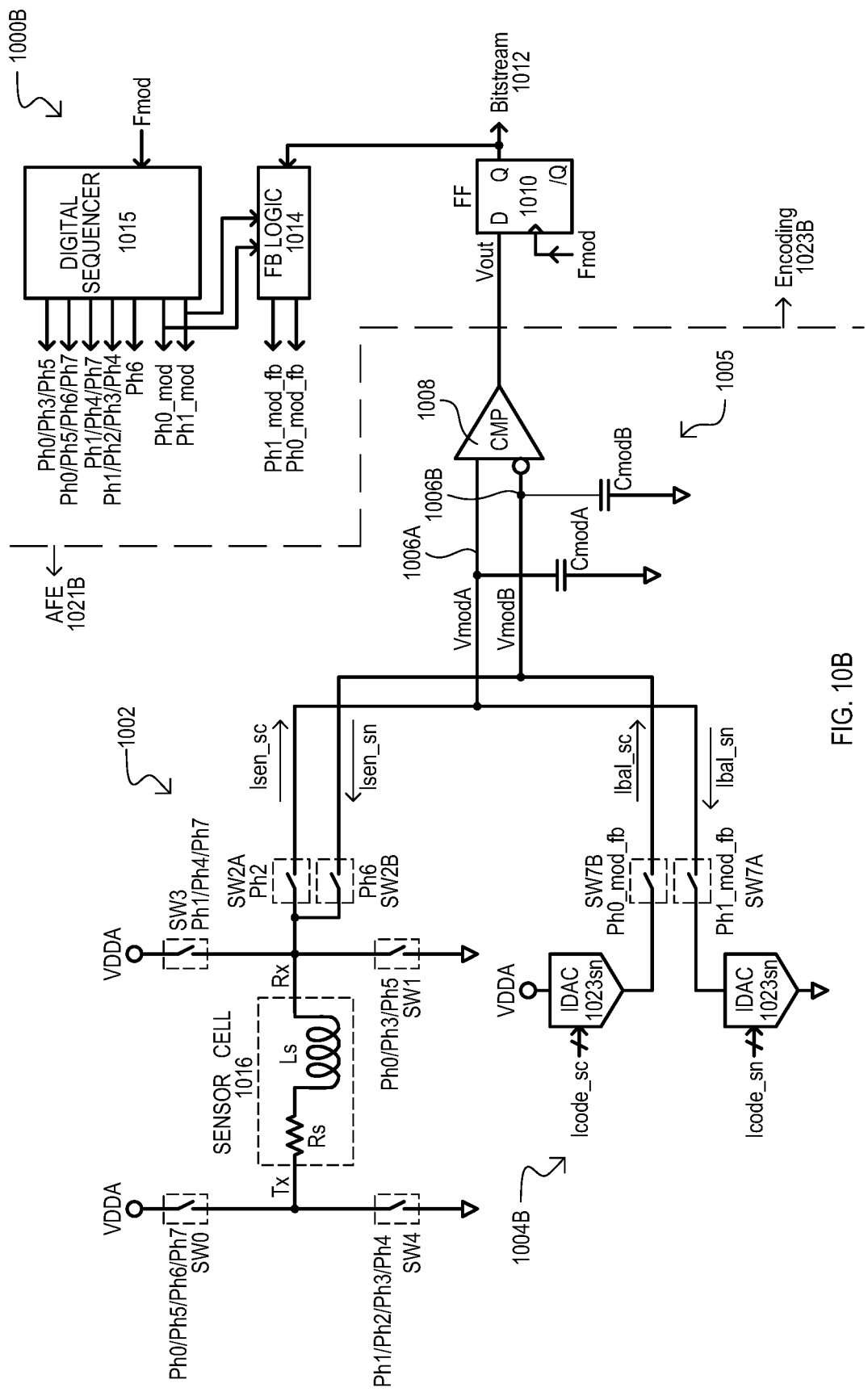
FIG. 10B is a schematic diagram of a pseudo-differential inductive sensing device according to another embodiment.

FIG. 10B is a schematic diagram of an inductive sensing device 1000B that utilizes pseudo-differential sensing according to another embodiment. A device 1000B can include items like those of FIG. 10A, and such like items can operate in the same general fashion.

FIG. 10B can differ from that of FIG. 10A in that a balance section 1004B can utilize current digital to analog converters (iDACs) 1027sc and 1027sn to generate balance currents. iDACs 1027sc/sn are programmable to provide currents based on DAC codes Icode_sc and Icode_sn, respectively. In the embodiment shown, by operation of timing signal Ph0_mod_fb, iDAC 1027sn can be coupled to modulator node 1006A by SW7A to sink balance current Ibal_sn from modulator node 1006A. By operation of timing signal Ph1_mod_fb, iDAC 1027sc can be coupled to modulator node 1006B by SW7B to source balance current Ibal_sc to modulator node 1006B.

It is understood that in any of the embodiments disclosed herein, iDACs can be used to generate balance currents and/or reference currents in lieu of switched capacitor circuits.

FIGS. 11A to 11H are a series of diagrams showing sensing phases for inductive sensing according to a pseudo-differential embodiment, including those shown in FIGS. 10A and 10B.

Figure 11A:
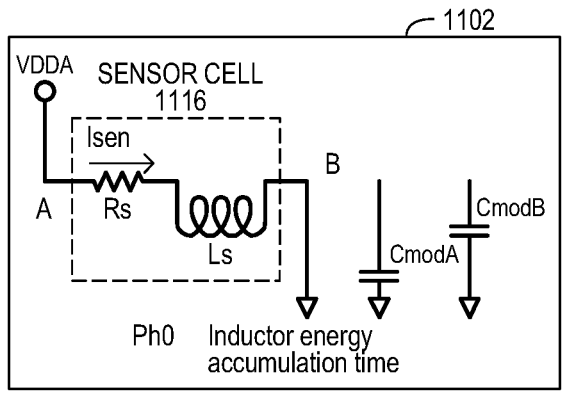
FIGS. 11A to 11H are a sequence of diagrams showing different phases of an inductance sensing operation according to another embodiment.

FIG. 11A shows a first phase (Ph0), which can be a first energizing phase. In Ph0, by operation of one or more switches (e.g., SW0, SW1), terminal A can be coupled to VDDA. At the same time, terminal B can be coupled to ground.

Figure 11B:
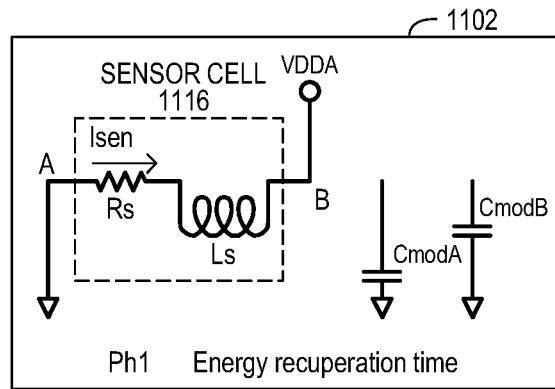

FIG. 11B shows a second phase (Ph1), which can be an optional energy recuperation phase. In Ph1, by operation of switches (e.g., SW3 and SW4), terminal A can be coupled to ground, while terminal B can be coupled to VDDA.

Figure 11C:
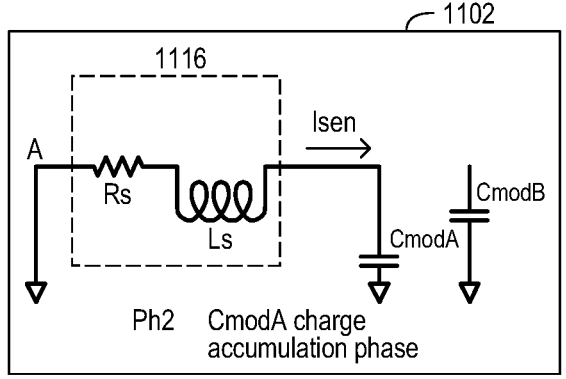

FIG. 11C shows a third phase (Ph2), which can be a first charge accumulation phase. In Ph2, by operation of switches (e.g., SW2A, SW4), terminal B can be coupled to a first modulator capacitance (CmodA) and terminal A can be coupled to ground to induce a fly-back current from Ls. Due to the fly-back current (Isen), charge can accumulate on CmodA.

Figure 11D:
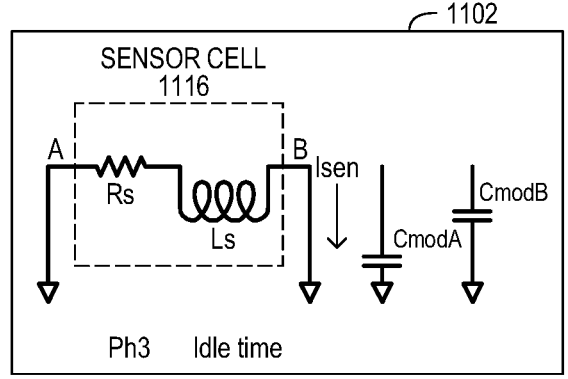

FIG. 11D shows a fourth phase (Ph3), which can be an optional idle phase. In Ph3, by operation of switches (e.g., SW1 and SW4), terminals A and B can be coupled to ground.

Figure 11E:
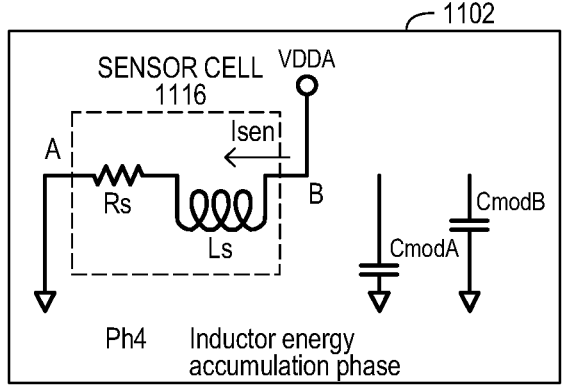

FIG. 11E shows a fifth phase (Ph4), which can be a second energizing phase. In Ph4, by operation of one or more switches (e.g., SW3, SW4), terminal B can be coupled to VDDA and terminal A can be coupled to ground to energize Ls.

Figure 11F:
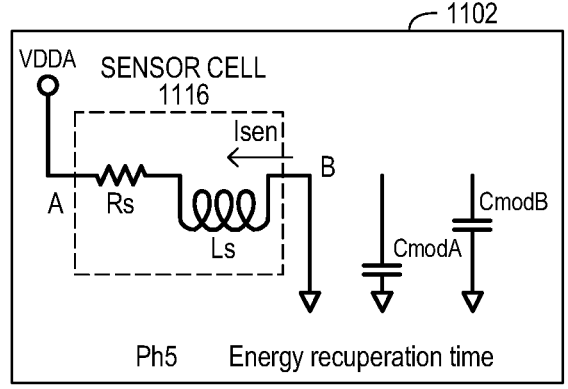

FIG. 11F shows a sixth phase (Ph5), which can be an optional energy recuperation phase. In Ph5, by operation of switches (e.g., SW0, SW1), terminal A can be coupled to VDDA, while terminal B can be coupled to ground.

Figure 11G:
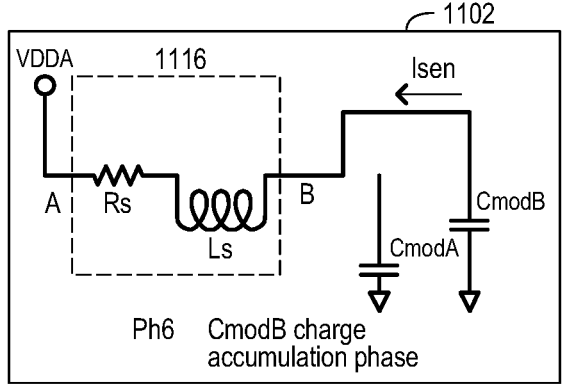

FIG. 11G shows a seventh phase (Ph6), which can be a second charge accumulation phase. In Ph6, by operation of switches (e.g., SW0, SW2B), terminal B can be coupled to a second modulator capacitance (CmodB) and terminal A can be coupled to VDDA to induce a fly-back current from Ls. Due to fly-back current (Isen), current can be drawn from CmodB.

Figure 11H:
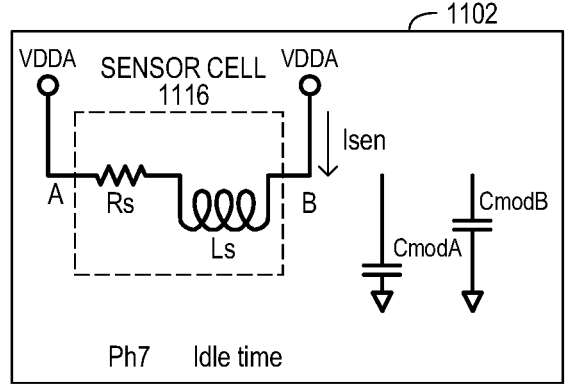

FIG. 11H shows an eighth phase (Ph7), which can be an optional idle phase. In Ph7, by operation of switches (e.g., SW0, SW3), terminals A and B can be coupled to VDDA.

Figure 12:
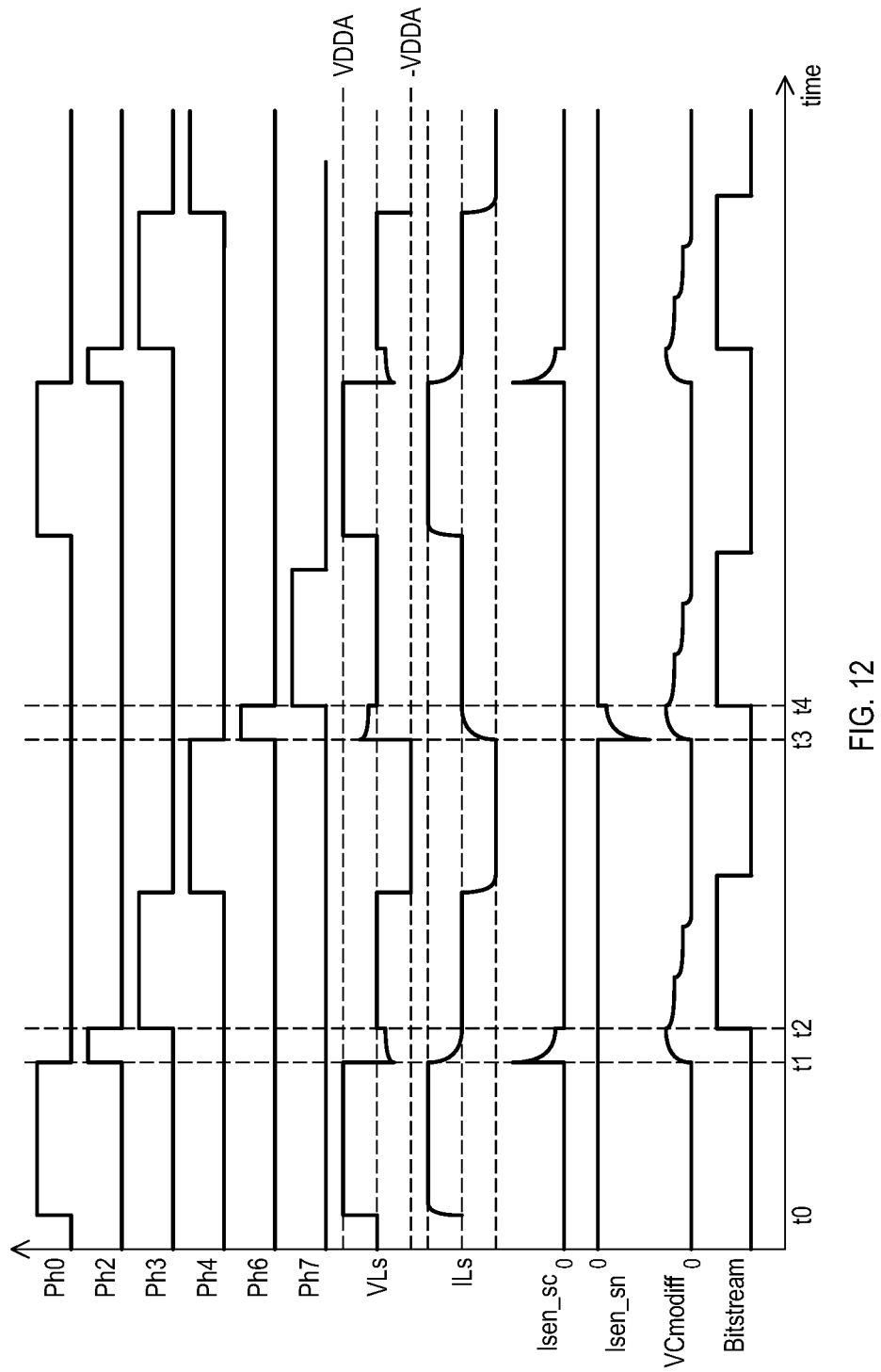
FIG. 12 is a timing diagram showing a pseudo-differential inductance sensing operation according to another embodiment.

Referring to FIG. 12, a timing diagram is shown for operations for devices like those shown in FIGS. 10A/B. The timing diagram shows: the various sensing phases Ph0, Ph2, Ph3, Ph4, Ph6, Ph7; an inductor voltage VLs; an inductor current ILs; a resulting first fly-back current Isen_sc at a first modulator node; a resulting second fly-back current Isen_sn at a second modulator node; a differential voltage across first and second modulator nodes; and a resulting Bitstream. It is noted that FIG. 12 shows operations that do not include optional energy recuperation phases Ph1 and Ph5.

The various phases are understood from FIGS. 11A to 11H.

In an embodiment like that of FIGS. 10A/B, accumulated charge on modulator capacitances CmodA and CmodB can be balanced by charge generated with switch capacitor Cref in a balance section (e.g., 1004A/B). The balance condition can be given by:

$$Q_{ph2\_max} + Q_{ph6\_max} < 2 \cdot V_{DDA} \cdot C_{ref} \cdot N_{b\_min}$$

$Q_{ph2\_max}$ is the maximum charge that can be produced in sense cycle Ph2. $Q_{ph6\_max}$ is the maximum charge that can be produced in sense cycle Ph6. $N_{b\_min}$ can be the minimal required amount of Fmod cycles to reach a balance. A difference between single-ended and pseudo-differential configuration can be understood from the Qph2 and Qph6 values. The Isen current changes sign during these phases because a settling operation caused by a balance current (Ibal) drives a modulation node away from VDDA/2. In particular, in Ph2, a settling process can tend to pull a VmodA voltage toward ground. In Ph6, a settling process can tend to drive VmodB toward VDDA. This means that Qph2 and Qph6 can alternate during the Ph2 and Ph6 periods. This property can limit Ph2 and Ph6 period duration as understood by the inductance-to-code transfer function can be given by:

$$D_x = \frac{3}{2 \cdot R_s^2 \cdot C_{ref} \cdot N_{b\_min}} \cdot \left(1 - e^{-\frac{R_s}{L_s} \cdot T_{ph2}}\right) \cdot L_s - \frac{T_{ph2}}{2 \cdot R_s \cdot C_{ref} \cdot N_{b\_min}}$$

Figure 13:
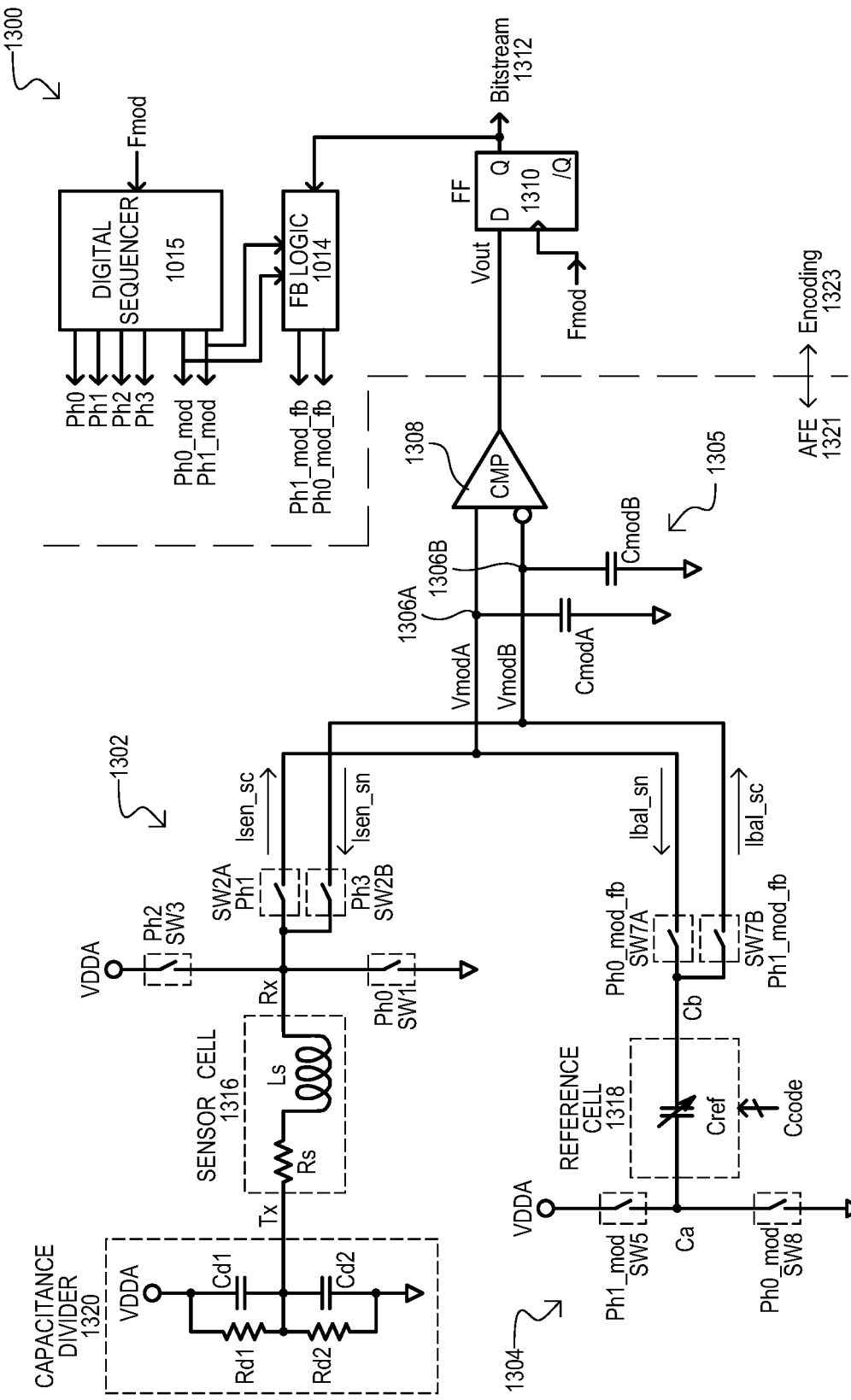
FIG. 13 is a schematic diagram of a pseudo-differential inductive sensing device according to an embodiment.

FIG. 13 is a schematic diagram of an inductive sensing device 1300 according to another embodiment. A sensing device 1300 can employ differential sensing without the phase duration limitations of that noted above by use of a capacitive divider 1320. Sensing device 1300 can include items like those of FIG. 10A, and such like items can operate in the same general fashion.

A sensing device 1300 can differ from that of FIG. 10A in that a fly-back section 1302 can include a capacitance divider 1320 in place of switches SW0 and SW4. Capacitance divider 1320 can include a divider capacitance Cd1 and divider resistance Rd1 arranged in series between VDDA and node Tx, and a divider capacitance Cd2 and divider resistance Rd2 arranged in series between node Tx and ground.

FIGS. 14A to 14D are a series of diagrams showing sensing phases for inductive sensing according to a pseudo-differential embodiment, including that shown in FIG. 13. By operation of a voltage divider, a sensor node terminal A can be maintained at a voltage between VDDA and ground, in this case VDDA/2.

Figure 14A:
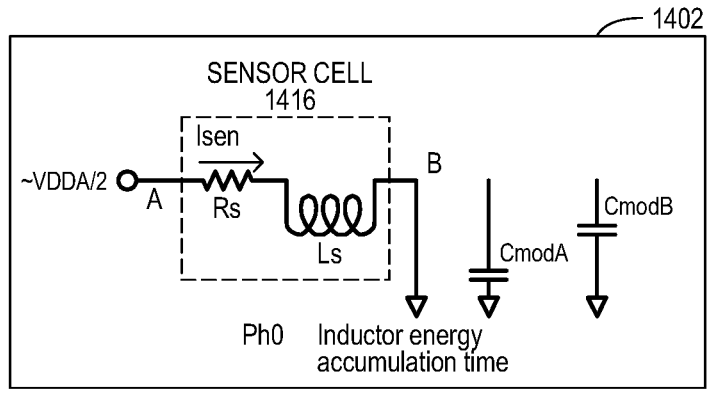
FIGS. 14A to 14D are a sequence of diagrams showing different phases of a pseudo-differential inductance sensing operation according to another embodiment.

FIG. 14A shows a first phase (Ph0), which can be a first energizing phase. In Ph0, by operation of one or more switches (e.g., SW1), terminal B can be coupled to ground while terminal A is coupled to VDDA/2 to energize sensor inductance Ls.

Figure 14B:
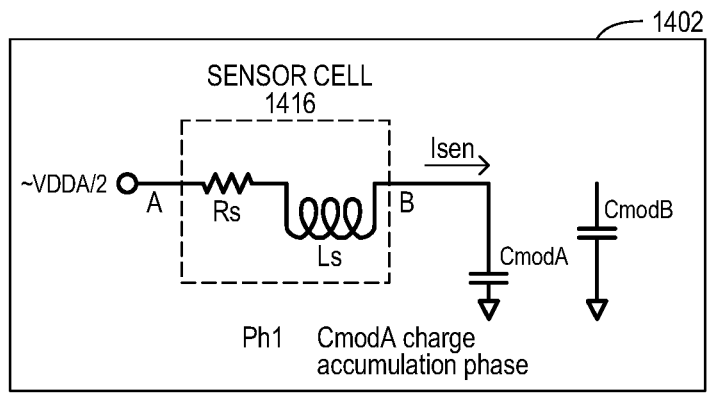

FIG. 14B shows a second phase (Ph1), which can be a first charge accumulation phase. In Ph1, by operation of switches (e.g., SW2A), terminal B can be coupled to a first modulator capacitance (CmodA) while terminal A remains at VDDA/2. This can induce a first fly-back current with Ls. Due to fly-back current (Isen), charge can accumulate on CmodA.

Figure 14C:
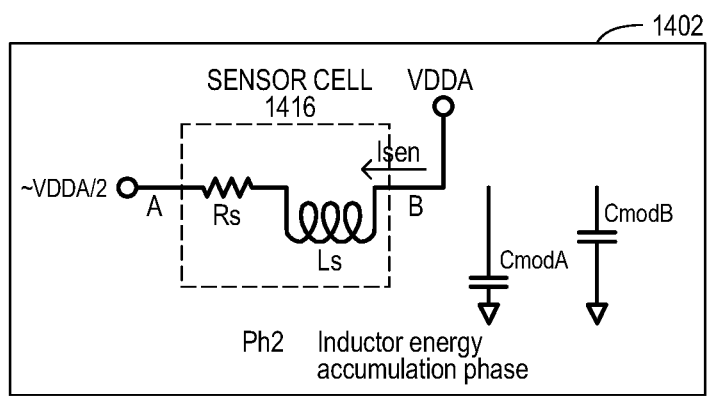

FIG. 14C shows a third phase (Ph2), which can be a second energizing phase. In Ph0, by operation of one or more switches (e.g., SW3), terminal B can be coupled to VDDA while terminal A remains at VDDA/2. This can energize sensor inductance Ls.

Figure 14D:
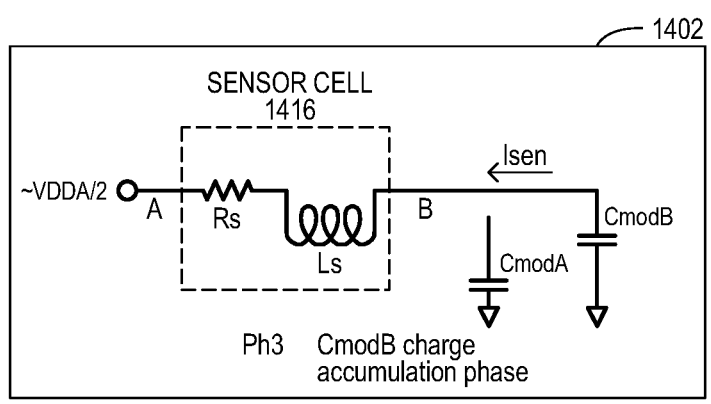

FIG. 14D shows a fourth phase (Ph3), which can be a second charge accumulation phase. In Ph3, by operation of switches (e.g., SW2B), terminal B can be coupled to a second modulator capacitance (CmodB) while terminal A remains at VDDA/2. This can induce a second fly-back current with Ls opposite to that of Ph1. Due to the fly-back current, charge can be drawn from CmodB.

In some embodiments, an energy recuperation period can be added between phases Ph0 and Ph1 and/or between phases Ph2 and Ph3.

Figure 15:
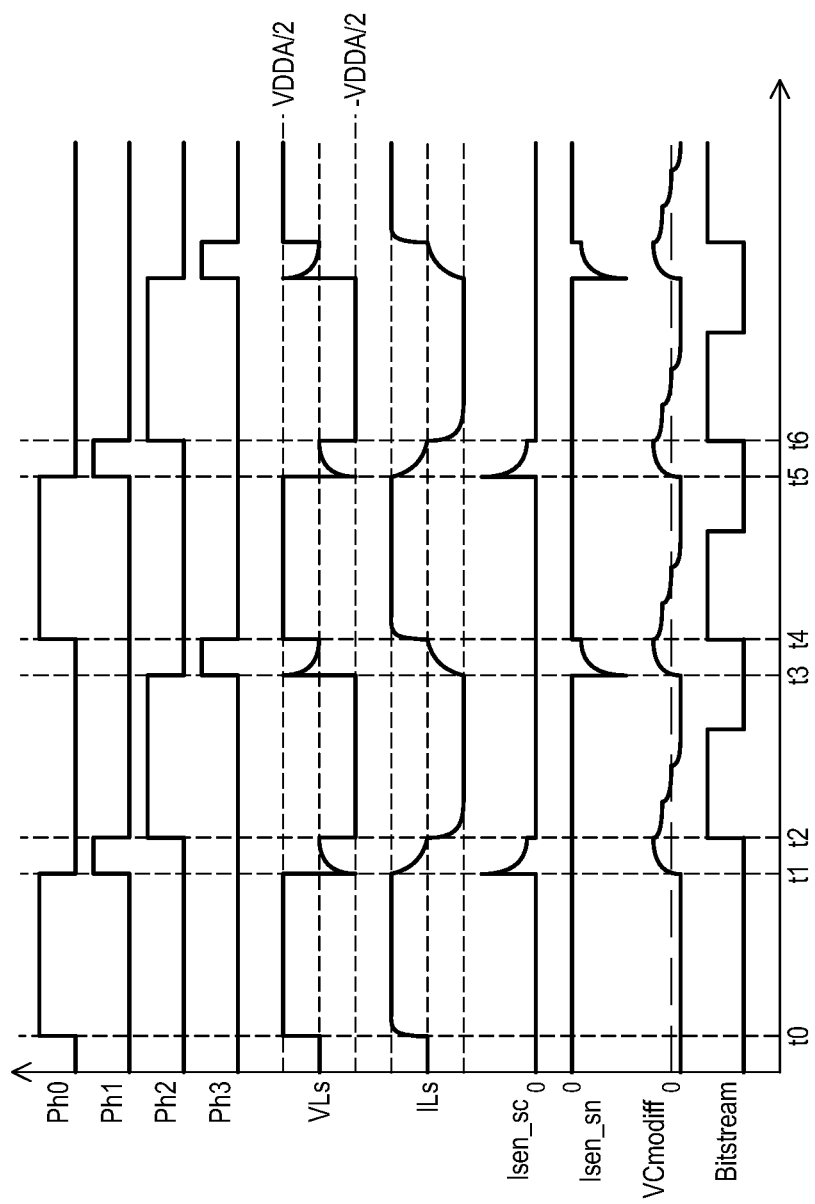
FIG. 15 is a timing diagram showing a pseudo-differential inductance sensing operation according to an embodiment.

Referring to FIG. 15, a timing diagram is shown for operations of a device like that shown in FIG. 13. The timing diagram shows: the various sensing phases Ph0-Ph3; an inductor voltage VLs; an inductor current ILs; a resulting first sensed current Isen_sc; a resulting second sensed current Isen_sn; a differential voltage across modulation nodes; and a resulting Bitstream.

The various phases are understood from FIGS. 14A to 14D.

Figure 16A:
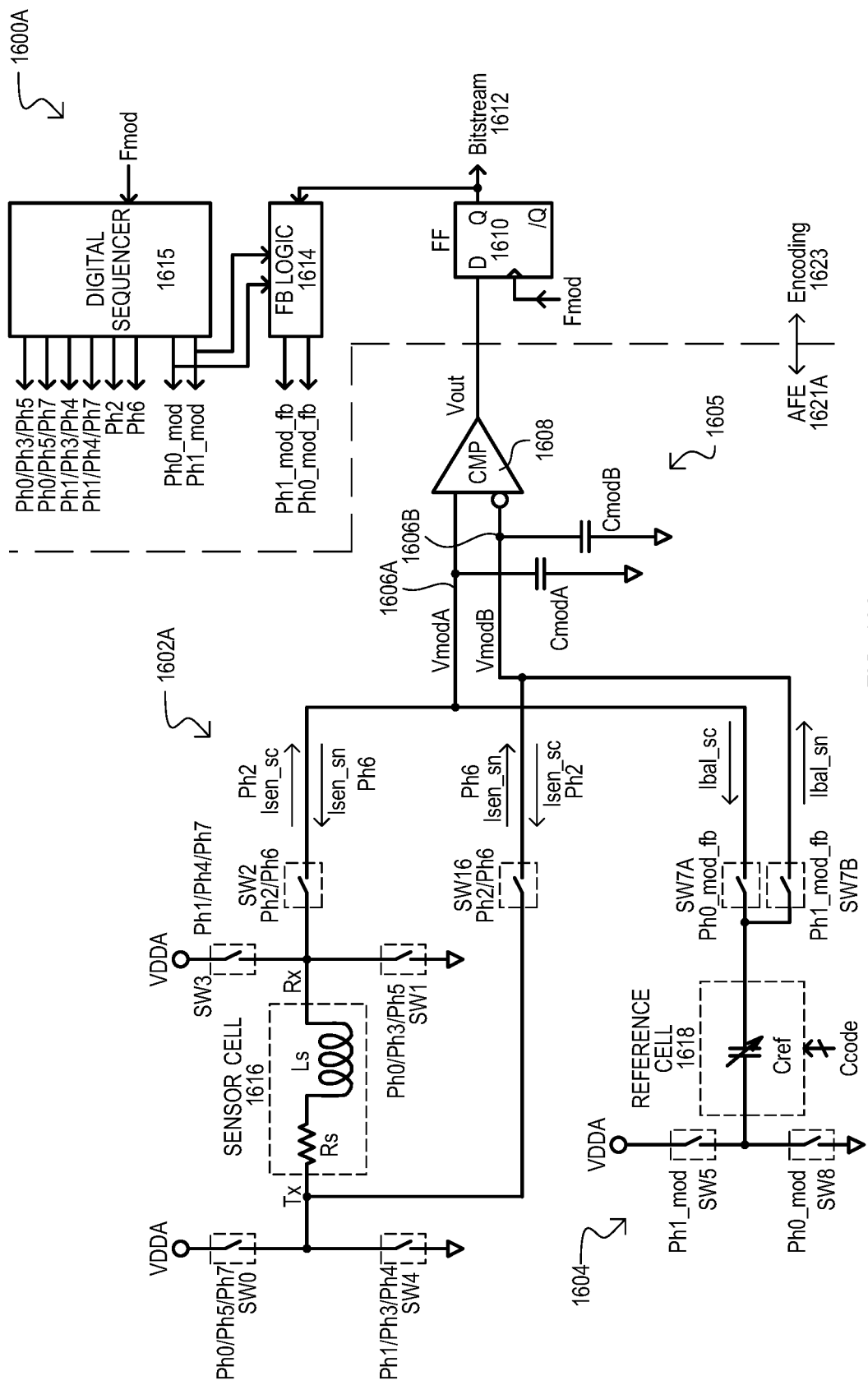
FIG. 16A is a schematic diagram of a pseudo-differential inductive sensing device according to another embodiment.

FIG. 16A is a schematic diagram of an inductive sensing device 1600A according to another embodiment. A sensing device 1600A can couple a sensor inductance across differential modulator nodes. Sensing device 1600A can include items like those of FIG. 13, and such like items can operate in the same general fashion.

A sensing device 1600A can differ from that of FIG. 13 in that a fly-back section 1602A can further include analog switches SW0, SW4 and can include SW2 and SW16 in place of SW2A and SW2B. SW0 can be controlled by signals Ph0/Ph5/Ph7 to couple node Tx to VDDA. SW4 can be controlled by signals Ph1/Ph3/Ph4 to couple node Tx to ground. SW2 can be controlled by signals Ph2/Ph6 to couple node Rx to modulator node 1606A. SW16 can be controlled by signals Ph2/Ph6 to couple Tx to modulator node 1606B. In one phase (i.e., Ph2) of a sensing operation, an inductive sensor 1616 can be coupled across modulator nodes 1606A/B to induce a fly-back current in one direction. In another phase (i.e., Ph6) of a sensing operation, inductive sensor 1616 can be coupled across modulator nodes 1606A/B and induce a fly-back current in the opposite direction.

Figure 16B:
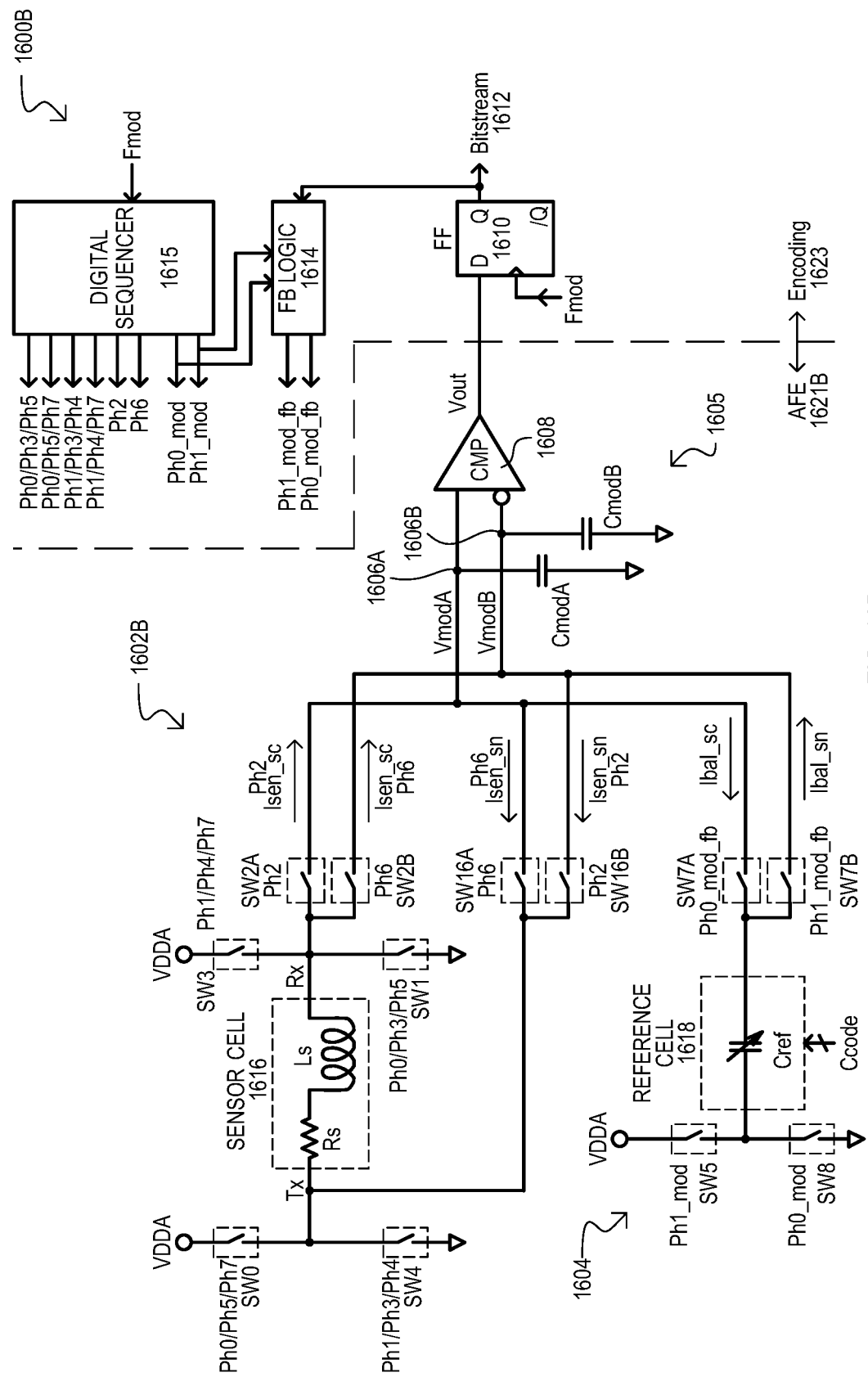
FIG. 16B is a schematic diagram of a pseudo-differential inductive sensing device according to a further embodiment.

FIG. 16B is a schematic diagram of an inductive sensing device 1600B according to another embodiment. A sensing device 1600B can couple a sensor inductance across differential modulator nodes in different configurations. Sensing device 1600B can include items like those of FIG. 16A, and such like items can operate in the same general fashion.

A sensing device 1600B can differ from that of FIG. 16A in that a fly-back section 1602B can include analog switches SW2A/B in place of SW2 and switches SW16A/B in place of SW16. SW2A can be controlled by signal Ph2 to couple node Rx to modulator node 1606A. SW2B can be controlled by signal Ph6 to couple node Rx to modulator node 1606B. SW16A can be controlled by signal Ph6 to couple node Tx to modulator node 1606A. SW16B can be controlled by signal Ph2 to couple node Tx to modulator node 1606B. In one phase (i.e., Ph2) of a sensing operation, an inductive sensor 1616 can be coupled across modulator nodes 1606A/B in a first configuration so that a fly-back current flows in one direction with respect to first and second modulator nodes 1606A/B. In another phase (i.e., Ph6) of a sensing operation, an inductive sensor 1616 can be coupled across modulator nodes 1606A/B in a second configuration so that a fly-back current flows in an opposite direction with respect to first and second modulator nodes 1606A/B.

FIGS. 17A to 17H are a series of diagrams showing sensing phases for an inductive sensing operation according to an embodiment like that of FIG. 16A.

Figure 17A:
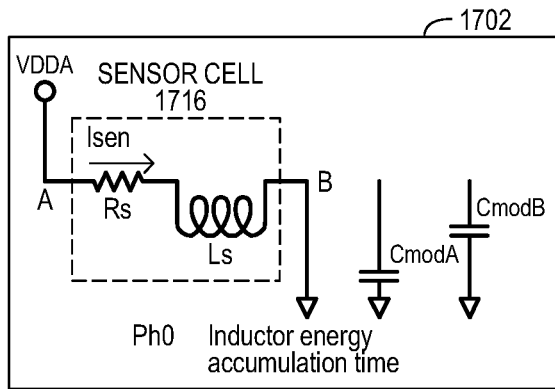
FIGS. 17A to 17H are a sequence of diagrams showing different phases of a pseudo-differential inductance sensing operation according to another embodiment.

FIG. 17A shows a first phase (Ph0), which can be a first energizing phase. In Ph0, by operation of one or more switches (e.g., SW0, SW1), terminal A can be coupled to VDDA and terminal B can be coupled to ground to energize Ls.

Figure 17B:
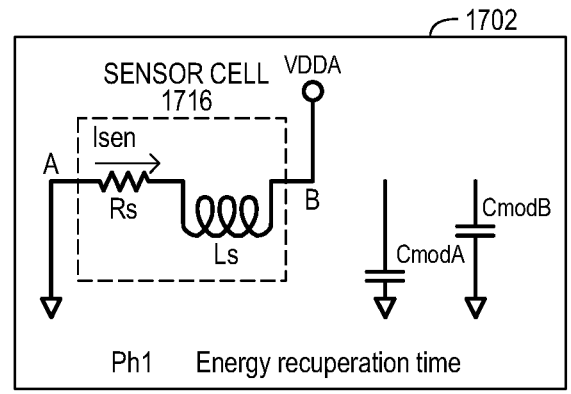

FIG. 17B shows a second phase (Ph1), which can be an optional energy recuperation phase. In Ph1, by operation of switches (e.g., SW3, SW4), terminal A can be coupled to ground, while terminal B can be coupled to VDDA.

Figure 17C:
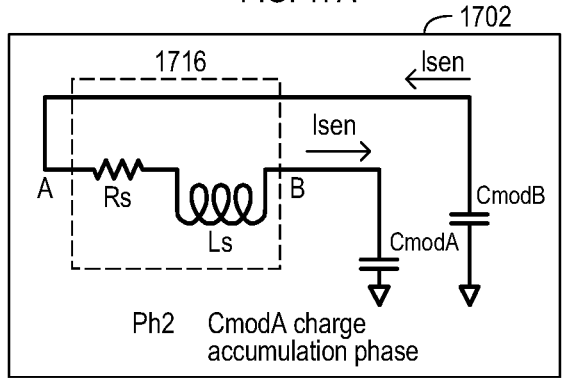

FIG. 17C shows a third phase (Ph2), which can be a first charge accumulation phase. In Ph2, by operation of switches (e.g., SW2, SW16), terminal B can be coupled to a first modulator capacitance (CmodA) and terminal A can be coupled to a second modulator capacitance (CmodB). This can induce a fly-back current from Ls. Due to fly-back current (Isen), charge can accumulate on CmodA and discharge from CmodB.

Figure 17D:
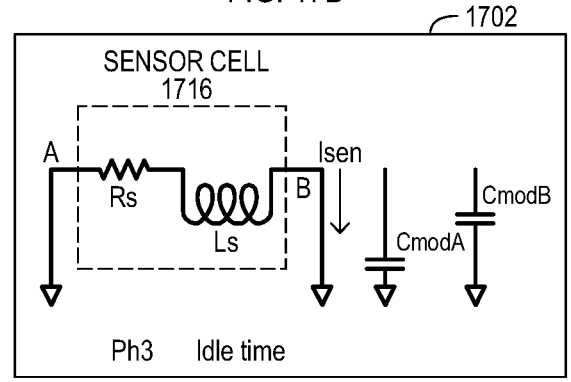

FIG. 17D shows a fourth phase (Ph3), which can be an optional idle time. In Ph2, by operation of switches (e.g., SW1, SW4), terminals A and B can be coupled ground.

Figure 17E:
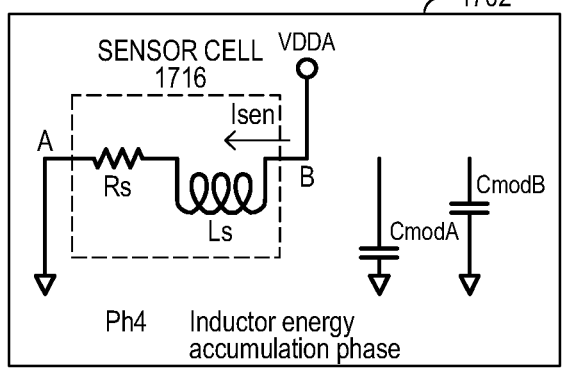
Figure 17F:
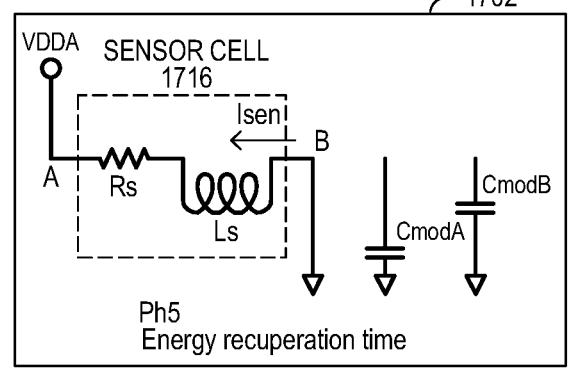

FIG. 17E shows a fifth phase (Ph4), which can be a second energizing phase. In Ph4, by operation of one or more switches (e.g., SW3, SW4), terminal A can be coupled to ground, while terminal B can be coupled to VDDA FIG. 17F shows a sixth phase (Ph5), which can be an optional energy recuperation phase. In Ph5, by operation of switches (e.g., SW0, SW1), terminal A can be coupled to VDDA, while terminal B can be coupled to ground.

Figure 17G:
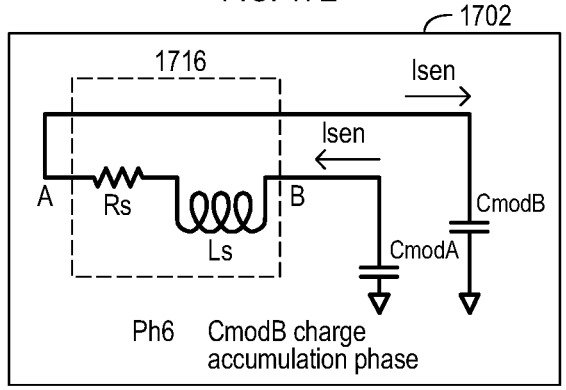

FIG. 17G shows a seventh phase (Ph6), which can be a second charge accumulation phase. In Ph6, by operation of switches (e.g., SW2, SW16), terminal B can be coupled to a first modulator capacitance (CmodA) and terminal A can be coupled to a second modulator capacitance (CmodB). This can induce a fly-back current from Ls opposite to that from Ph2. Due to fly-back current (Isen_sn), charge can accumulate on CmodB and discharge from CmodA.

Figure 17H:
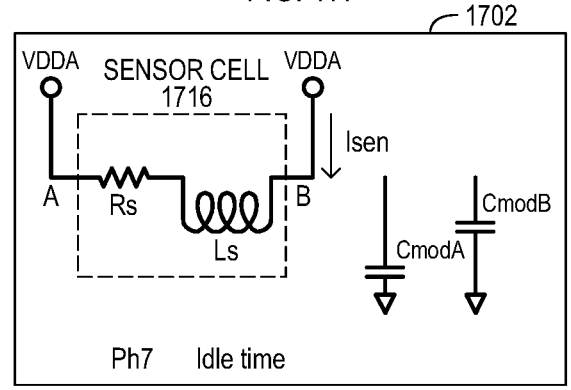

FIG. 17H shows an eighth phase (Ph7), which can be an optional idle time. In Ph7, by operation of switches (e.g., SW0, SW3), terminals A and B can be coupled VDDA.

A balanced state can be reached if a balance maximum current is higher than a maximum sense current.

FIGS. 17I to 17O are a series of diagrams showing sensing phases for an inductive sensing operation according to an embodiment like that of FIG. 16B.

Figure 17I:
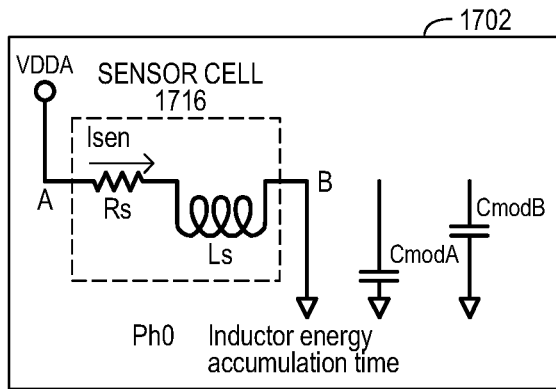
FIGS. 17I to 17P are a sequence of diagrams showing different phases of a pseudo-differential inductance sensing operation according to a further embodiment.

FIG. 17I shows a first phase (Ph0), which can be a first energizing phase. In Ph0, by operation of one or more switches (e.g., SW0, SW1), terminal A can be coupled to VDDA and terminal B can be coupled to ground to energize Ls.

Figure 17J:
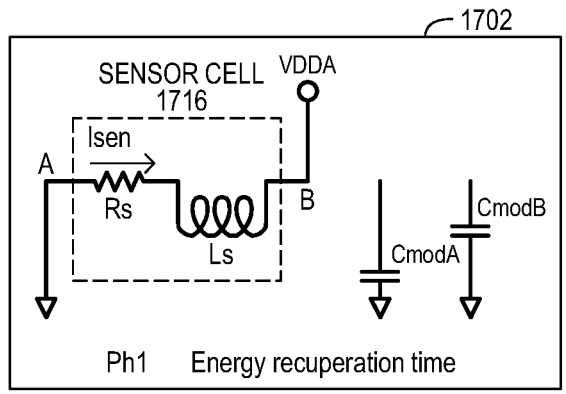

FIG. 17J shows a second phase (Ph1), which can be an optional energy recuperation phase. In Ph1, by operation of switches (e.g., SW3, SW4), terminal A can be coupled to ground, while terminal B can be coupled to VDDA.

Figure 17K:
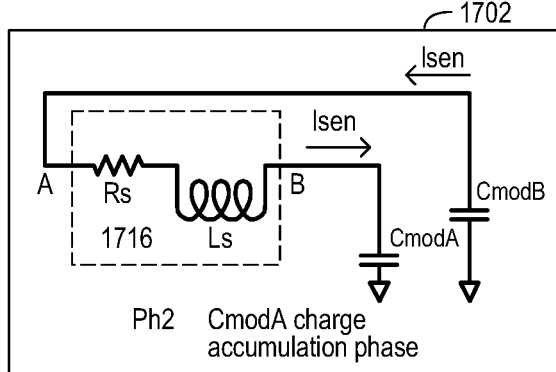

FIG. 17K shows a third phase (Ph2), which can be a first charge accumulation phase. In Ph2, by operation of switches (e.g., SW2A, SW16B), terminal B can be coupled to a first modulator capacitance (CmodA) and terminal A can be coupled to a second modulator capacitance (CmodB). This can induce a fly-back current from Ls. Due to fly-back current (Isen), charge can accumulate on CmodA and discharge from CmodB.

Figure 17L:
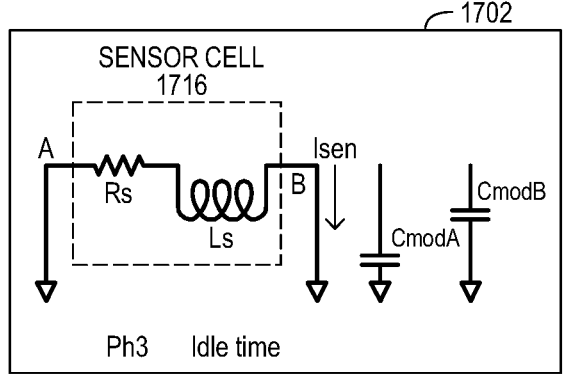

FIG. 17L shows a fourth phase (Ph3), which can be an optional idle time. In Ph2, by operation of switches (e.g., SW1, SW4), terminals A and B can be coupled ground.

Figure 17M:
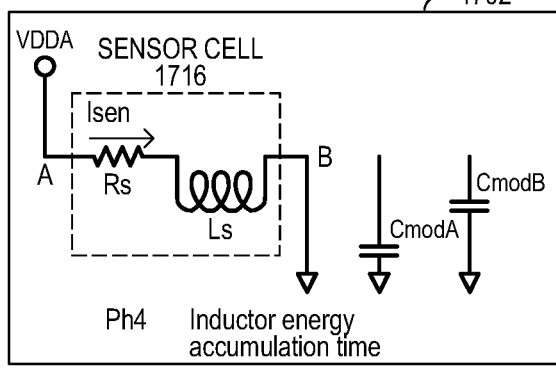

FIG. 17M shows a fifth phase (Ph4), which can be a second energizing phase. In the embodiment shown, Ph4 can be the same as Ph0.

Figure 17N:
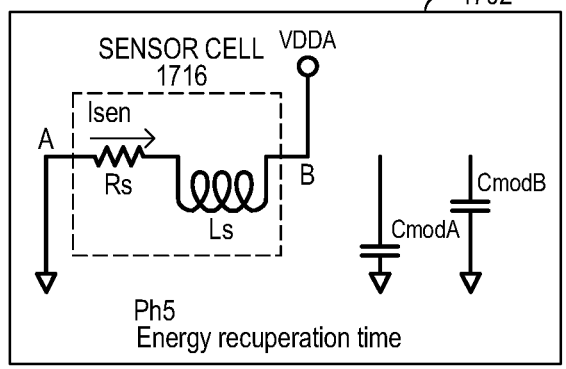

FIG. 17N shows a sixth phase (Ph5), which can be an optional energy recuperation phase. In the embodiment shown, Ph5 can be the same as Ph1.

Figure 17O:
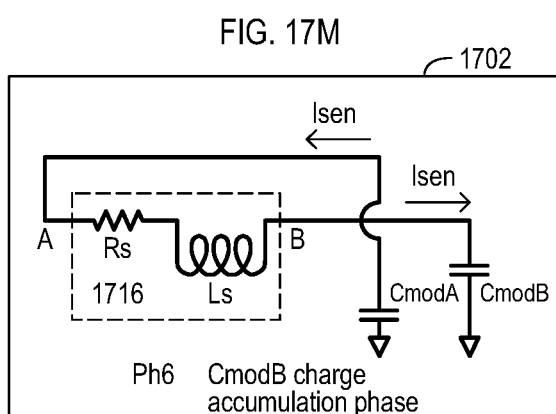

FIG. 17O shows a seventh phase (Ph6), which can be a second charge accumulation phase. In Ph6, by operation of switches (e.g., SW2B, SW16A), terminal A can be coupled to a first modulator capacitance (CmodA) and terminal B can be coupled to a second modulator capacitance (CmodB). This can induce a fly-back current from Ls. Due to fly-back current (Isen), charge can accumulate on CmodA and discharge from CmodB.

Figure 17P:
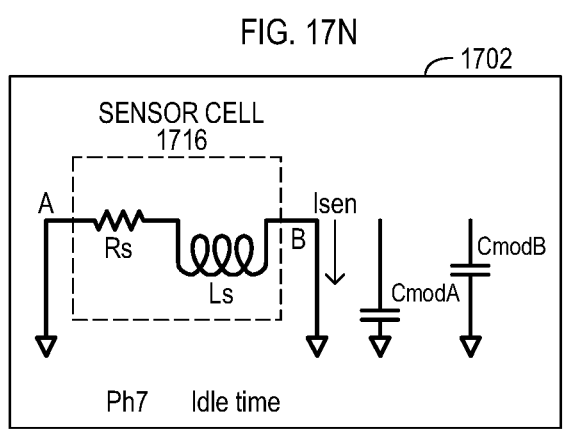

FIG. 17P shows a seventh phase (Ph6), which can be an optional idle time. In the embodiment shown, Ph6 can be the same Ph3

Embodiments with pseudo-differential sensing can include compensation sections for generating compensation currents as described for single ended embodiments. Such an embodiment is shown in FIG. 18.

Figure 18:
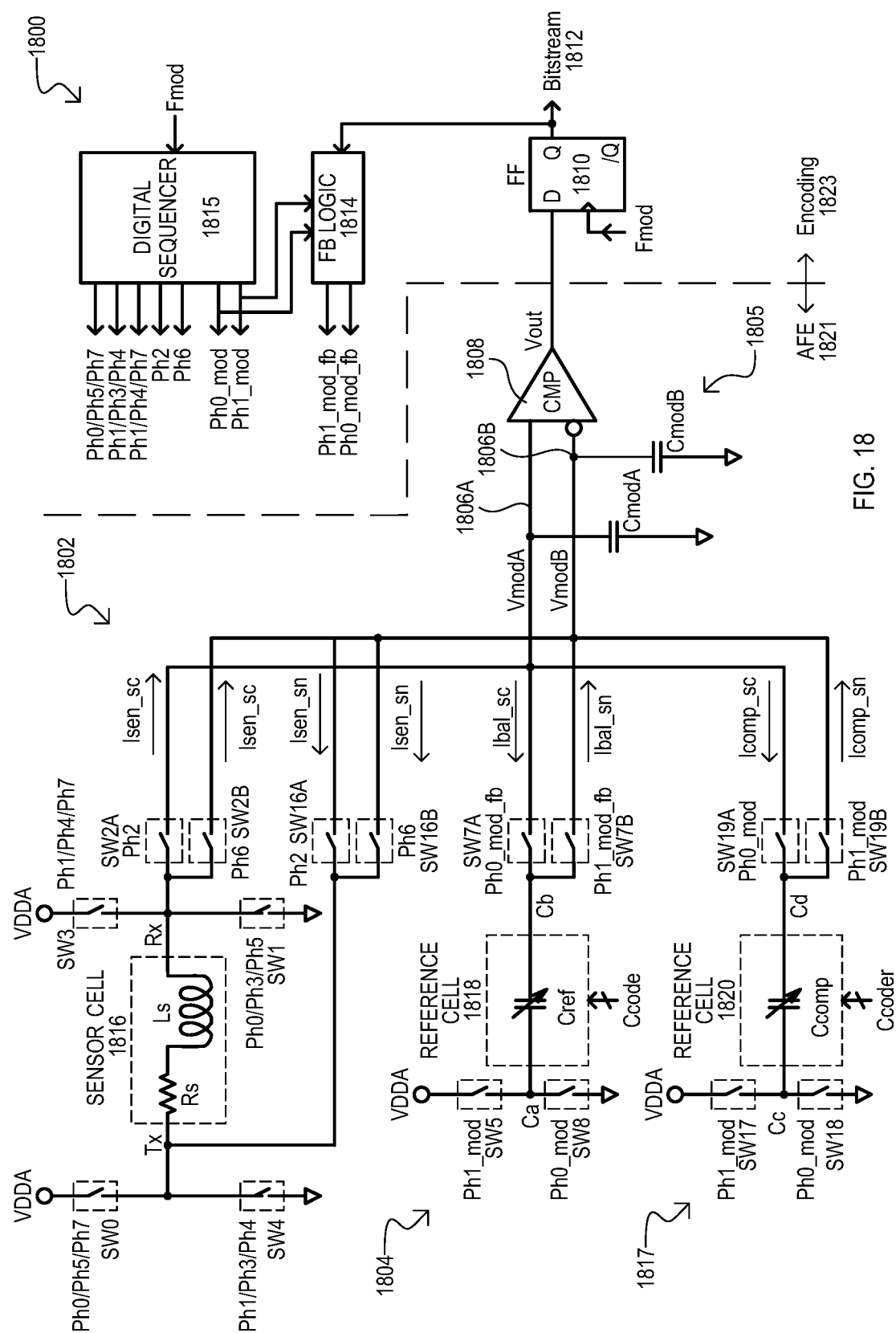
FIG. 18 is a schematic diagram of a pseudo-differential inductive sensing device that uses a compensation current according to an embodiment.

FIG. 18 is a schematic diagram of an inductive sensing device 1800 according to a further embodiment. A sensing device 1800 can include items like those of FIG. 16B, and such like items can operate in the same general fashion.

FIG. 18 and differ from FIG. 16B in that it can include a compensation section 1817. Compensation section 1817 can include switches SW17, SW18, SW19A and SW19B. SW17 can be controlled by Ph1_mod to couple node Cc to VDDA. SW18 can be controlled by Ph0_mod to couple node Cc to ground. SW19A can be controlled by Ph0_mod to couple node Cd to first modulator node 1606A. SW19B can be controlled by Ph1_mod to couple node Cd to second modulator node 1606B. By switched capacitor action, a compensation section 1817 can generate a first compensation current Icomp_sc that sinks current from modulator node 1806A and a second compensation current Icomp_sn that sources current to second modulator node 1806B.

It is understood a compensation section like that of FIG. 18 or an equivalent, can be included in any of the pseudo-differential sensing embodiments disclosed herein.

Figure 19:
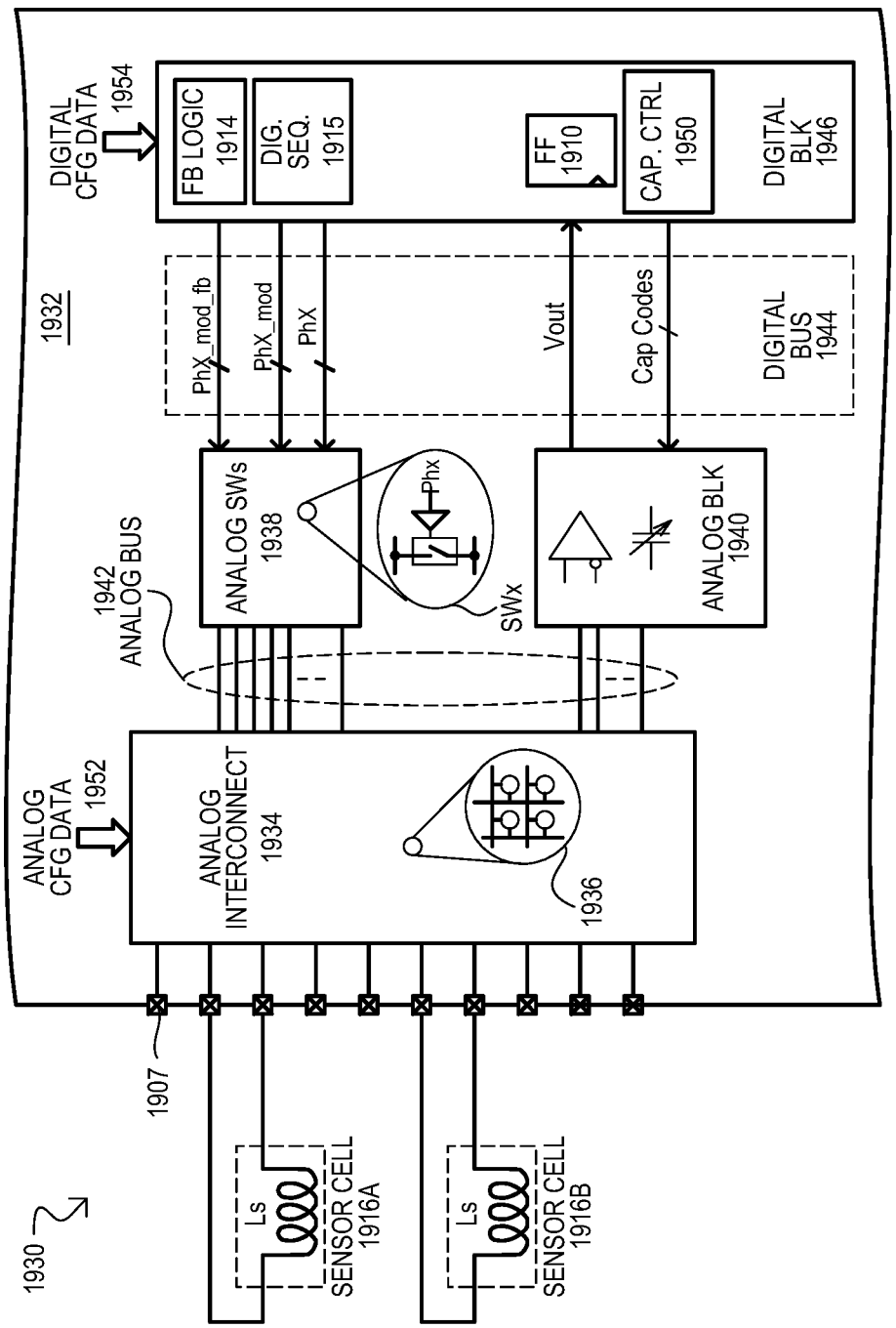
FIG. 19 is a block diagram of a system according to an embodiment.

Embodiments can take any suitable circuit form, however, some embodiments can form parts of larger integrated circuit (IC) devices, such as systems-on-chip (SoCs). FIG. 19 is a block diagram of such an embodiment.

FIG. 19 is a block diagram of a system 1930 according to an embodiment. A system 1930 can include an IC device 1932 and one or more inductive sensor cells (two shown as 1916A, 1916B). IC device 1932 can be an inductive sensing device. In some embodiments, an IC device 1932 can be programmable, and with configuration data, configured into an inductive sensing device.

IC device 1932 can include analog interconnect 1934, configurable analog switches 1938, and configurable analog circuit block 1940 in communication with one another over an analog bus system 1942. IC device 1932 can also include configurable digital blocks 1946 which can be coupled to configurable programmable analog switches 1938 and configurable analog circuit block 1940 by a digital bus system 1944.

Analog interconnect 1934 can be coupled to external connections (one shown as 1907) and can include a matrix formed of programmable connections (a portion shown as 1936). Interconnections can be established within analog interconnect 1934 with analog configuration data 1952. Configurable analog switches 1938 can include analog switches (one shown as SWx) that can be controlled by signals provided by digital bus (PhX_mod_fb, PhX_mod, PhX). Configurable analog circuit block 1940 can include various analog circuit blocks, including one or more comparators and one or more programmable capacitances (and/or IDACs). One or more outputs (Vout) from comparators can be provided to digital bus system 1944. Programmable capacitances can be programmed by Cap Codes via digital bus system 1944.

Configurable digital blocks 1946 can include digital circuits configurable into various arithmetic logic functions by digital configuration data 1954. Such various arithmetic logic functions can include feedback logic 1914, digital sequencers 1915 and FFs 1910 as described herein. Configurable digital blocks 1946 can also include a capacitor controller 1950, which can store and provide capacitance codes to programmable capacitances in configurable analog circuit block 1940.

Analog configuration data 1952 and digital configuration data 1954 can configure device 1932 into an inductive sensing device by coupling the various circuit components together according to any of the embodiments disclosed herein, or equivalents.

In some embodiments, a system 1930 can sense the inductance from multiple sensor cells 1916A/B. If such sensing is not simultaneous, sensing circuits can be shared. As but one example, different sets of analog switches can be configured as fly-back sections and coupled to each sensor cell 1916A/B. However, one set of analog switches can be configured into a balance section that utilizes a programmable capacitance. The programmable capacitance can be set to different values by capacitor codes for sensing with each sensor cell 1916A/B. A set of analog switches can be similarly configured into a compensation section.

Figure 20:
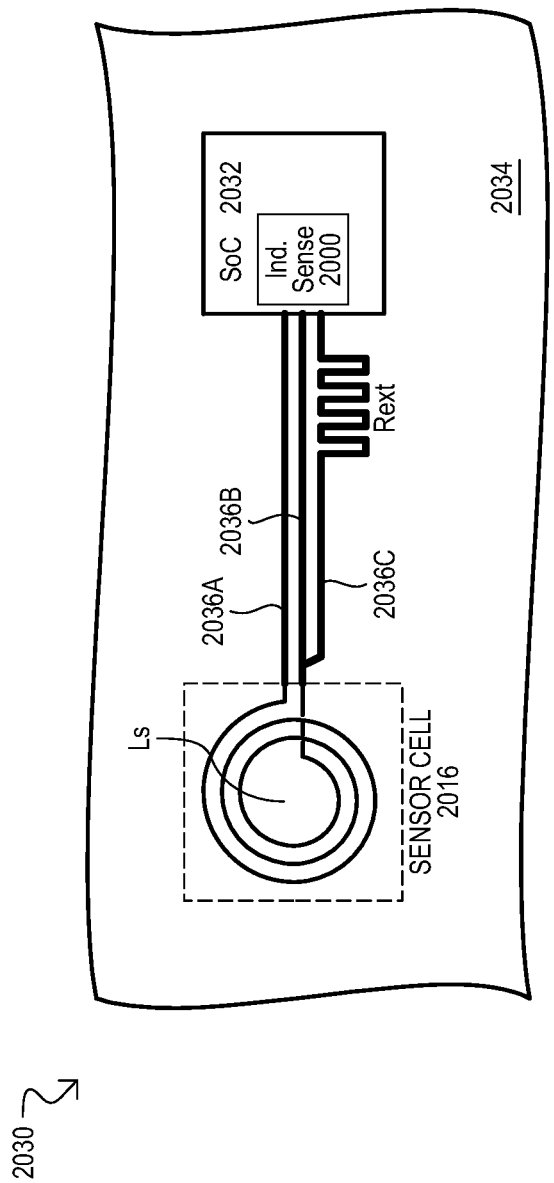
FIG. 20 is a block diagram of a system according to another embodiment.

FIG. 20 is a diagram of a system 2030 according to another embodiment. A system 2030 can include an inductive sensor 2016 and IC device 2032 formed on a circuit board 2034. IC device 2032 can include an inductive sensing device 2000 according to any of the embodiments shown herein, or an equivalent.

In some embodiments, inductive sensor 2016 can be formed with circuit board traces. Inductive sensor 2016 can be coupled to IC device 2032 by circuit board traces 2036A, 2036B and 2036C. Circuit board trace 2036C can include a resistance Rext. In some embodiments, circuit board traces 2036A, 2036B and 2036C can form a three-point connection to sensing device 2000 like that shown in FIG. 3. In some embodiments, multiple inductive sensors 2016 can be formed on circuit board 2034 and coupled to sensing device 2000.

While the various devices and systems have disclosed a number of inductive sensing methods, additional methods will now be described with reference to a number of flow diagrams.

Figure 21:
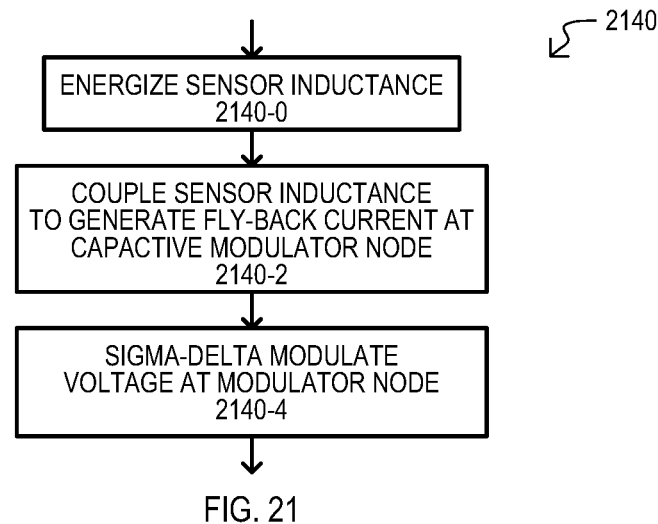
FIG. 21 is a flow diagram of an inductance sensing method according to an embodiment.

FIG. 21 is a flow diagram of a method 2140 according to an embodiment. A method 2140 can include energizing a sensor inductance 2140-0. Such an action can include coupling terminals of an inductive sensor across a potential by operation of an integrated circuit device. A sensor inductance can be coupled to generate a fly-back current at a capacitive modulator node 2140-2. Such an action can include coupling one terminal to the modulator node and the other terminal to a voltage that can induce the fly-back current. In some embodiments, a fly-back current can charge a modulator node. In some embodiments, a fly-back current can discharge a modulator node. A method 2140 can sigma-delta modulate a voltage at the modulator node 2140-4. Such an action can include quantizing a modulator voltage at the modulator node over time to generate a bitstream indicative of a sensor inductance. In some embodiments, such quantization can occur by operation of a comparator. However, embodiments should not be construed as being limited to single-bit quantization.

Figure 22:
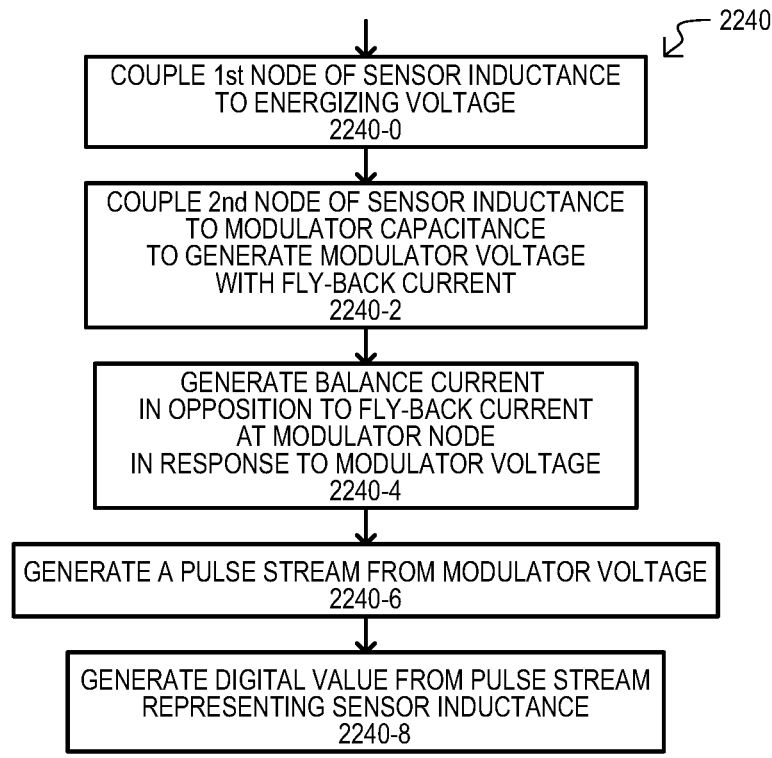
FIG. 22 is a flow diagram of an inductance sensing method according to another embodiment.

FIG. 22 is a flow diagram of a method 2240 according to another embodiment. A method 2240 can include coupling a first node of a sensor inductance to an energizing voltage 2240-0. Such an action can include coupling a first node of a sensor inductance to one voltage while the other node is coupled to a different voltage. A first node coupling to the energizing voltage can be static or dynamic. After the sensor inductance is energized, a second node of the sensor inductance can be coupled to a modulator capacitance to generate a modulator voltage with a fly-back current 2240-2.

A method 2240 can also include generating a balance current in opposition to the fly-back current at the modulator node in response to the modulator voltage 2240-4. Such an action can include generating a balance current that will reduce the modulator voltage 2240-4 during a sampling period. In some embodiments, a balance current can be generated with a switched capacitor operation. A switched capacitor operation can include charging a reference capacitor with a voltage at a first node, then switching the voltage at the first node while the second node is coupled to the modulator capacitance. In some embodiments, a reference capacitor is programmable, and the balance current can be programmed by setting the reference capacitor. In addition or alternatively, a balance current can be varied by switched capacitor timing.

A method 2240 can include generating a pulse stream (e.g., bit stream or pulse stream generated from higher order quantization) from the modulator voltage 2240-6. In some embodiments, such an action can include applying the modulator voltage to a comparator and latching a comparator output according to a clock signal. In some embodiments, the balance current can be generated in response to switching signals modulated by the pulse stream.

Digital codes can be generated from the pulse stream representing sensor inductance 2240-8. In some embodiments such an action can include activating a counter with the pulse stream. Periodically, counter values can be sampled and the counter reset. Stored counter values can represent the sensor inductance. Embodiments can also include one or more digital filters and decimators of first or higher orders.

Figure 23:
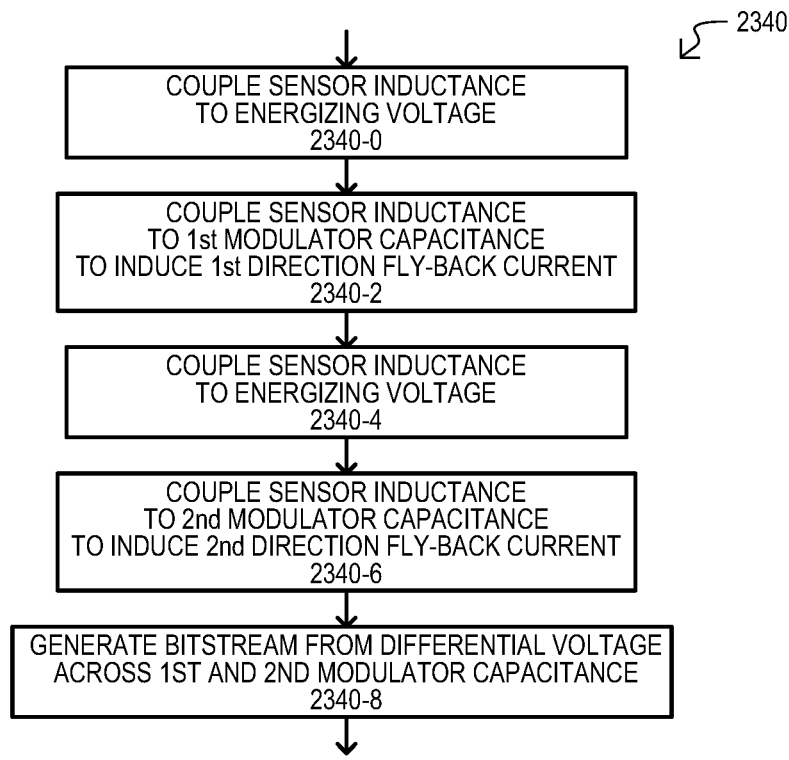
FIG. 23 is a flow diagram of an inductance sensing method according to another embodiment.

FIG. 23 is a flow diagram of a method 2340 of pseudo-differential inductance sensing according to an embodiment. A method 2340 can include coupling a sensor inductance to an energizing voltage 2340-0. Such a coupling can be static or dynamic. After the sensor inductance is energized, a sensor inductance can be coupled to a first modulator capacitance to induce a first fly-back current at a first modulator capacitance. A first direction fly-back current can have a first flow direction.

A method 2340 can include coupling a sensor inductance to an energizing voltage 2340-4 for a second time. Such a coupling can be static or dynamic. Such a coupling may be the same as, or different than, the coupling made in 2340-0. A sensor inductance can be coupled to a second modulator capacitance to induce a second fly-back current at a second modulator capacitance 2340-6. A second fly-back current can flow in a direction opposite to the first direction.

A method 2340 can include generating a bitstream from a differential voltage developed across the first and second modulator capacitances 2340-8. Such an action can include quantizing the differential voltage over time according to any of the embodiments disclosed herein, or equivalents.

Figure 24:
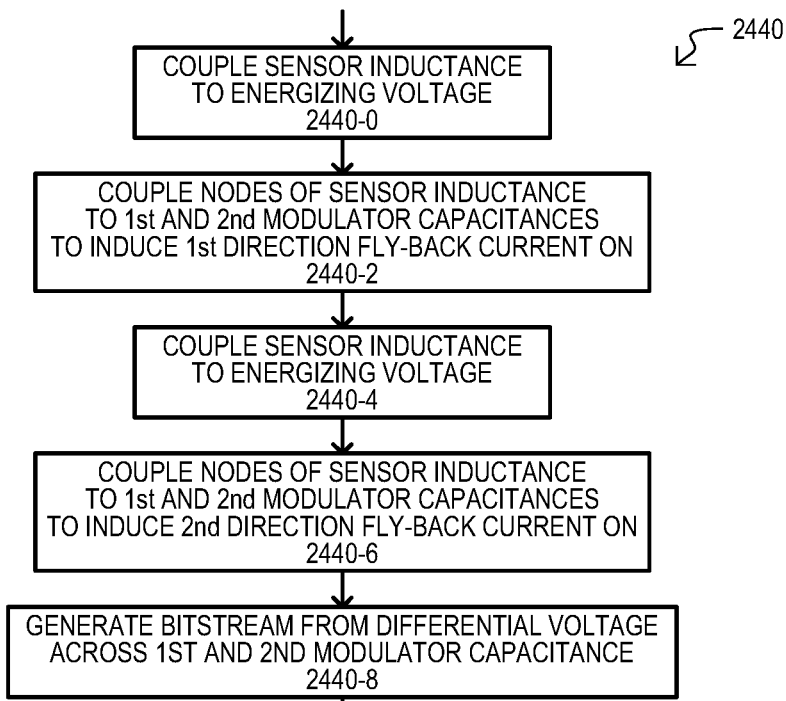
FIG. 24 is a flow diagram of an inductance sensing method according to another embodiment.
Figure 25:
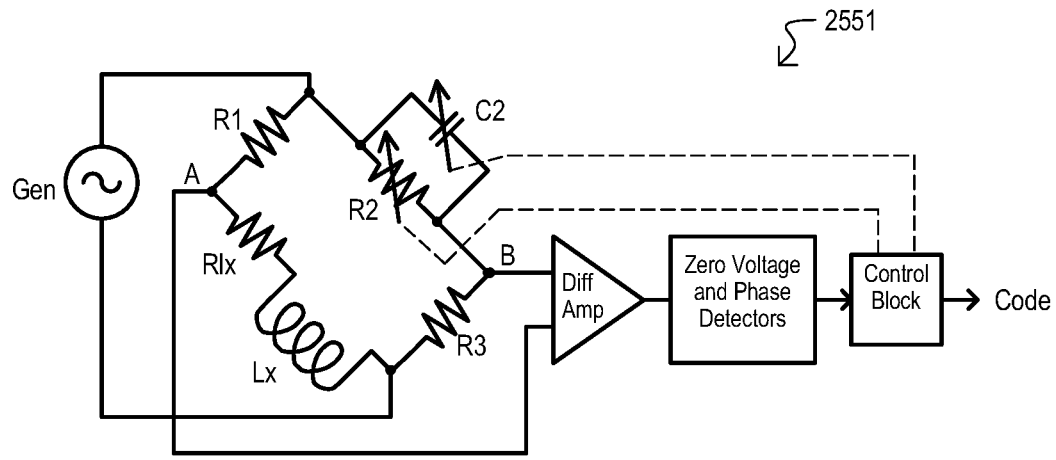
FIG. 25 is a block diagram of a conventional inductance sensor.

FIG. 24 is a flow diagram of a method 2440 of pseudo-differential sensing of a sensor inductance according to another embodiment. A method 2440 can include coupling a sensor inductance to an energizing voltage 2440-0. Such an action can take the form of any of those disclosed herein or equivalents. After the sensor inductance is energized, nodes of the sensor inductance can be coupled to first and second modulator capacitances to induce a first fly-back current 2440-2. Such an action can include coupling one node of sensor inductance to a first modulator capacitance and another node of the sensor inductance to a second modulator capacitance. A resulting fly-back current can charge a first modulator capacitance and discharge a second modulator capacitance.

A method 2440 can include coupling a sensor inductance to an energizing voltage 2440-4. Such an action can be the same as, or different than, that of 2440-0. Following the second energizing of the sensor inductance, nodes of the sensor inductance can be coupled to first and second modulator capacitances to induce a second direction fly-back current 2440-6. Such an action can include coupling nodes of a sensor inductance to first and second modulator capacitances to generate a fly-back current can discharge a first modulator capacitance and charge a second modulator capacitance.

A method 2440 can include generating a bitstream from a differential voltage developed across the first and second modulator capacitances 2340-8. Such an action can include any of the embodiments disclosed herein (such as those described with reference to FIG. 1A), or equivalents.

According to embodiments, an inductance-to-code converter based on a fly-back principal can be insensitive to clock frequencies, current sources, and supply and reference-voltage variations. Such a converter architecture can be more flexible than conventional approaches, allowing for the adjustment of sensing frequency, resolution and sensitivity over a wide range of sensor inductance, as compared to conventional approaches.

Embodiments can provide inductive sensing solutions in which sensitivity and resolution can be varied over a wide range. In some embodiments, this can include using balance currents and or reference currents to maximize a modulator current generated for a given sensor inductance variation.

According to embodiments, an inductance sensing device can have a simple analog front-end for inductance sensing that uses only analog switches and comparator. According to embodiments, inductance-to-code conversions can be relatively linear, in contrast to conventional approaches having an inverse square relationship.

According to embodiments, a simple hardware set (e.g., analog switches) can be utilized to implement multiple possible sensing modes (e.g., single ended, capacitor divider, pseudo-differential) as well as multi-sensing (i.e., sensing inductance of multiple sensors).

According to embodiments, an inductance sensor excitation frequency can be determinate, and can be selected by a user. This is in contrast to conventional approaches in which a sensor inductance can dictate an acceptable range of excitation frequencies. Further, in some embodiments, a selected inductance sensor excitation frequency can be used for other sensors of a system, such as capacitance sensors.

According to embodiments, an inductance sensor system can operate regardless of expected variations in power supply levels.

In embodiments having a pseudo-differential configuration, if internal routing is made symmetrical, essentially all common-mode noise can be rejected at comparator inputs.

Embodiments can provide for simple and accurate calibration. If a reference inductance value is known, an absolute value generated by the sensing system can be used to calibrate a conversion transfer function.

While embodiments disclose inductance energizing and generating fly-back currents based on a same clock (e.g., Fmod), alternate embodiments can employ different timing of such phases to optimize performance.

Embodiments can provide inductor sensing with lower power consumption than conventional approaches.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method, comprising:
   in a first phase of a sensing operation, controlling at least a first switch to energize a sensor inductance;
   in a second phase of the sensing operation that follows the first phase,
      controlling at least a second switch to couple the sensor inductance to a first modulator capacitance to induce a first fly-back current from the sensor inductance, the first fly-back current generating a first modulator voltage at the first modulator capacitance, and
      in response to the first modulator voltage, controlling at least a third switch to generate a balance current that flows in an opposite direction to the fly-back current at the first modulator node;
   repeating the at least first and second phases to generate a first modulator voltage at the first modulator capacitance; and
   converting at least the first modulator voltage into a digital value representing the sensor inductance.

2. The method of claim 1, wherein:
   controlling the at least the first switch includes electrically coupling a first terminal of the sensor inductance to a first power supply; and
   controlling at least the second switch includes coupling a second terminal of the sensor inductance to the first modulator capacitance.

3. The method of claim 1, further including:
   in the second phase of the sensing operation,
      controlling at least a fourth switch to generate a compensation current at the first modulator capacitance having the opposite direction to the fly-back current.

4. The method of claim 1, further including:
   in the first phase of a sensing operation, electrically coupling a first terminal of the sensor inductance to a first supply node with at least the first switch;
   in the second phase of the sensing operation electrically coupling a second terminal of the sensor inductance to the first modulator capacitance with at least the second switch;
   in a third phase of the sensing operation that follows the second phase, electrically coupling the second terminal of the sensor inductance to the first supply node;
   in a fourth phase of the sensing operation that follows the third phase, electrically coupling the second terminal of the sensor inductance to a second modulator capacitance to induce a second fly-back current, the second fly-back current generating a second modulator voltage at the second modulator capacitance; and
   repeating the at least first through fourth phases to generate a differential voltage between the first and second modulator capacitances; and
   converting the differential voltage into the digital value representing the sensor inductance.

5. The method of claim 1, wherein:
   controlling the at least the first switch includes electrically coupling a first terminal of the sensor inductance to a first supply node by the first switch while a second terminal of the sensor inductance is coupled to a reference voltage; and
   controlling at least the second switch includes coupling the second terminal of the sensor inductance to the first modulator capacitance.

6. The method of claim 1, further including:
   in the first phase of a sensing operation, having a first terminal of the sensor inductance coupled to a first supply node;
   in the second phase of the sensing operation, electrically coupling a second terminal of the sensor inductance to the first modulator capacitance with at least the second switch;
   in a third phase of the sensing operation that follows the second phase, energizing the sensor inductance for a second time;
   in a fourth phase of the sensing operation that follows the third phase, electrically coupling the second terminal of the sensor inductance to a second modulator capacitance;
   repeating the at least first through fourth phases to generate a differential voltage between the first and second modulator capacitances; and
   converting the differential voltage into the digital value representing the sensor inductance.

7. The method of claim 1, further including:
   in the first phase of a sensing operation, having a first terminal of the sensor inductance coupled to a first supply node;
   in the second phase of the sensing operation,
      electrically coupling a second terminal of the sensor inductance to the first modulator capacitance with at least the second switch, and
      electrically coupling the first terminal of the sensor inductance to a second modulator capacitance with at least a fourth switch;
   in a third phase of the sensing operation that follows the second phase, energizing the sensor inductance for a second time;
   in a fourth phase of the sensing operation that follows the third phase,
      electrically coupling the second terminal of the sensor inductance to the second modulator capacitance with at least the second switch, and
      electrically coupling the first terminal of the sensor inductance to the first modulator capacitance with at least the fourth switch;
   repeating the at least first through fourth phases to generate a differential voltage between the first and second modulator capacitances; and
   converting the differential voltage into the digital value representing the sensor inductance.

8. The method of claim 1, further including:
   in the first phase of a sensing operation, having a first terminal of the sensor inductance coupled to a first supply node;
   in the second phase of the sensing operation,
      electrically coupling a second terminal of the sensor inductance to the first modulator capacitance with at least the second switch, and
      electrically coupling the first terminal of the sensor inductance to a second modulator capacitance with at least a fourth switch;
   in a third phase of the sensing operation that follows the second phase, energizing the sensor inductance for a second time;

in a fourth phase of the sensing operation that follows the third phase,
  electrically coupling the second terminal of the sensor inductance to the second modulator capacitance with at least a fifth switch, and
  electrically coupling the first terminal of the sensor inductance to the first modulator capacitance with at least a sixth switch;
repeating the at least first through fourth phases to generate a differential voltage between the first and second modulator capacitances; and
converting the differential voltage into the digital value representing the sensor inductance.

9. A device, comprising:
a plurality of input/outputs (I/Os), including at least a first I/O configured to couple to a first inductive sensor terminal and a second I/O configured to couple to a second inductive sensor terminal;
a plurality of switches;
a switch controller circuit configured to
  in a first phase of a sensing operation, operate at least a first switch to energize a sensor inductance of the first inductive sensor by enabling a current path to the sensor inductance,
  in a second phase of the sensing operation that follows the first phase,
    operate at least a second switch to couple the second I/O to a first modulator node and induce a first fly-back current from the sensor inductance that generates at least a first modulator voltage at the first modulator node, and
    in response to the first modulator voltage, operate at least a third switch to generate a balance current that subtracts from the first fly-back current at the first modulator node; and
an analog to digital conversion (ADC) circuit including
  a modulator circuit configured to generate a stream of pulses in response to at least the first modulator voltage, and
  an encoder configured to encode the stream of pulses into a digital values representing the sensor inductance.

10. The device of claim 9, wherein:
the I/Os, switches, first modulator node, ADC circuit and switch controller circuit are part of a same integrated circuit device.

11. The device of claim 9, wherein:
the switch controller circuit is configured to
  apply a balance capacitance code to set a programmable balance capacitance; wherein
the balance current varies in response to the programmable balance capacitance.

12. The device of claim 9, further including:
the switch controller circuit is configured to
  in a third phase of the sensing operation that follows the second phase, operate at least a fourth switch to energize the sensor inductance for a second time,
  in a fourth phase of the sensing operation that follows the third phase, operate at least a fifth switch to couple the second I/O to a second modulator node to generate a second fly-back current at the second modulator node, the second fly-back current flowing in a different direction than the first fly-back current; and
the modulator is configured to generate the stream of pulses in response to a differential voltage between the first modulator node and the second modulator node.

13. The device of claim 9, further including:
the switch controller circuit is configured to
  in the second phase of the sensing operation, operate at least a fourth switch to couple the first I/O to a second modulator node, the first fly-back current flowing to the first modulator node and from the second modulator node,
  in a third phase of the sensing operation that follows the second phase, operate at least a fifth switch to energize the sensor inductance for a second time,
  in a fourth phase of the sensing operation that follows the third phase,
    operate at least a sixth switch to couple the second I/O to the second modulator node, and
    operate at least a seventh switch to couple the first I/O to the first modulator node, and
the modulator is configured to generate the stream of pulses in response to a differential voltage between the first modulator node and the second modulator node.

14. The device of claim 9, wherein:
the switch controller circuit is configured to
  in the second phase of the sensing operation operate at least a fourth switch to generate a reference current that subtracts from the first fly-back current at the first modulator node, the reference current being independent of the first modulator voltage.

15. The device of claim 14, wherein:
the controller circuit is configured to
  apply a reference capacitance code to set a programmable reference capacitance; wherein
  the reference current varies in response to the programmable reference capacitance.

16. A system, comprising:
a sensor having a sensor inductance, a first terminal and a second terminal;
an inductive sensing device that includes
  a plurality of input/outputs (I/Os), including a first I/O coupled to the first terminal and a second I/O coupled to the second terminal,
  a plurality of switches,
  a switch controller circuit configured to
    in a first phase of a sensing operation, operate at least a first switch to energize the sensor inductance, and
    in a second phase of the sensing operation that follows the first phase, operate at least a second switch to couple the second I/O to a first modulator node to induce a first fly-back current from the sensor inductance that generates a first modulator voltage on the first modulator node;
  an analog to digital conversion (ADC) circuit including
    a modulator configured to generate a stream of pulses in response to at least the first modulator voltage, and
    an encoder configured to encode the stream of pulses into a digital values that represent the sensor inductance.

17. The system of claim 16, wherein:
the switch controller circuit is configured to
  in the first phase of a sensing operation,
    couple the first I/O to a first supply node with at least the first switch, and
    couple the second I/O to a second supply node with at least a third switch; wherein
    the first supply node being selected from the group of: a high power supply node and a reference supply node having a voltage between that of the high and low power supply nodes.

18. The system of claim 16, wherein:

the inductive sensing device includes the switch controller circuit is configured to in a third phase of the sensing operation that follows the second phase, operate at least a third switch to energize the sensor inductance for a second time, and in a fourth phase of the sensing operation that follows the third phase, operate at least a fourth switch to couple the second I/O to a second modulator node to induce a second fly-back current from the sensor inductance the generates a second modulator voltage on the second modulator node, the second fly-back current having a current flow opposite to that of the first fly-back current with respect to the sensor inductance; and the modulator is configured to generate the stream of pulses in response to a differential voltage between the first and second modulator nodes.

19. The system of claim 16, wherein:

the inductive sensing device includes the controller circuit is configured to in the second phase of the sensing operation, operate at least a third switch to couple the first I/O to a second modulator node, the first fly-back current flowing from the second modulator node and to the first modulator node, in a third phase of the sensing operation that follows the second phase, operate at least a fourth switch to energize the sensor inductance for a second time, and in a fourth phase of the sensing operation that follows the third phase, operate at least a fifth switch to couple the second I/O to the second modulator node and operate at least a sixth switch to couple the first I/O to the first modulator node to induce a second fly-back current from the sensor inductance having a current flow opposite to that of the first fly-back current; and the modulator is configured to generate the stream of pulses in response to a differential voltage between the first and second modulator nodes.

20. The system of claim 16, wherein:

the switch controller circuit is configured to in the second phase of the sensing operation, in response to at least the first modulator voltage, operate at least a third switch to generate a balance current, the balance current subtracting from the first fly-back current at the first modulator node.

21. The system of claim 16, further including:

a circuit board that includes circuit board traces including a first conductive path between the first terminal and the first I/O, a second conductive path between the second terminal and the second I/O, and a third conductive path between the second terminal and the second I/O, the third conductive path having a greater resistance than the second conductive path.

\* \* \* \* \*